(12) United States Patent
Kaneko

(10) Patent No.: US 9,242,279 B2
(45) Date of Patent: Jan. 26, 2016

(54) LIQUID PROCESSING APPARATUS AND LIQUID PROCESSING METHOD

(75) Inventor: Satoshi Kaneko, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 773 days.

(21) Appl. No.: 13/478,237

(22) Filed: May 23, 2012

(65) Prior Publication Data

US 2012/0298147 A1   Nov. 29, 2012

(30) Foreign Application Priority Data

May 24, 2011   (JP) .................................. 2011-116215
May 24, 2011   (JP) .................................. 2011-116216
May 24, 2011   (JP) .................................. 2011-116217

(51) Int. Cl.
*B08B 3/08* (2006.01)
*H01L 21/67* (2006.01)
*B08B 7/04* (2006.01)
*B08B 5/00* (2006.01)

(52) U.S. Cl.
CPC ... *B08B 3/08* (2013.01); *B08B 5/00* (2013.01); *B08B 7/04* (2013.01); *H01L 21/67051* (2013.01)

(58) Field of Classification Search
CPC .............. H01L 21/67051; H01L 21/68735; H01L 21/68785; H01L 21/68792; B08B 3/08; B08B 7/04; B08B 5/00
USPC ........................................ 134/94.1, 143, 157
See application file for complete search history.

(56) References Cited

U.S. PATENT DOCUMENTS

| | | | | |
|---|---|---|---|---|
| 7,387,131 | B2 * | 6/2008 | Kuroda | ............ H01L 21/67051 118/313 |
| 2007/0283983 | A1 * | 12/2007 | Park et al. | ........................ 134/21 |
| 2007/0289528 | A1 * | 12/2007 | Nanba | ..................... G03F 7/162 118/52 |

FOREIGN PATENT DOCUMENTS

| | | | | |
|---|---|---|---|---|
| JP | 10150015 | A | * 6/1998 | ............ H01L 21/304 |
| JP | 2003-151941 | A | 5/2003 | |
| JP | 2003-224100 | A | 8/2003 | |
| JP | 2008-066400 | A | 3/2008 | |
| JP | 2009-038083 | A | 2/2009 | |

* cited by examiner

*Primary Examiner* — Michael Kornakov
*Assistant Examiner* — Katelyn Whatley
(74) *Attorney, Agent, or Firm* — Abelman, Frayne & Schwab

(57) ABSTRACT

Provided are a liquid processing apparatus and a liquid processing method that can optimize the state of air flow at an upper side of a substrate according to each liquid process performed during a substrate liquid processing. A liquid processing apparatus for performing a substrate liquid processing includes a support member configured to horizontally supporting the substrate; a gap forming member configured to form an annular gap between the gap forming member and an outer circumferential part of the support member; an upper liquid supplying member configured to supply a processing liquid to the substrate from an upper side; a cup configured to surround the annular gap and receive the processing liquid swept away from the rotating substrate through the annular gap; and an elevating mechanism configured to elevate the gap forming member.

10 Claims, 18 Drawing Sheets

LIQUID PROCESSING APPARATUS AND LIQUID PROCESSING METHOD

CROSS-REFERENCE TO RELATED APPLICATIONS

This application is based on and claims priorities from Japanese Patent Application Nos. 2011-116215, 2011-116216 and 2011-116217 each of which filed on May 24, 2011 with the Japanese Patent Office, the disclosures of which are incorporated herein in their entireties by reference.

TECHNICAL FIELD

The present disclosure relates to a liquid processing apparatus and a liquid processing method for performing a substrate liquid processing.

BACKGROUND

In manufacturing a semiconductor device and a flat panel display (FPD), a liquid processing apparatus that performs a liquid processing of a substrate such as a semiconductor wafer and a glass substrate is used. There is a known liquid processing apparatus that horizontally supports and rotates a substrate and supplies a processing liquid to the rotating substrate.

The liquid processing apparatus rotates a substrate such that the processing liquid supplied onto the substrate is expanded outward to form a liquid film and the processing liquid is swept away toward outside the substrate. The processing liquid which is swept away by centrifugal force from the rotating substrate is recovered in a cup.

However, when the processing liquid is supplied to the surface of the substrate while the substrate is being rotated, mist or steam of the processing liquid is dispersed onto an upper side of the substrate. The dispersed mist or steam is attached to the substrate again, which causes the occurrence of particles on the substrate.

Therefore, a liquid processing apparatus, which forms air flow toward a cup from an upper side of a substrate by exhausting the liquid inside of the cup to prevent mist or steam from occurring at the upper side of the substrate, has been developed. See, for example, Japanese Patent Application Laid-Open Nos. 2009-038083 and 2008-066400.

An optimal state of air flow at an upper side of a substrate varies according to each liquid process performed during a substrate liquid processing. For example, a substrate liquid processing includes various processing-liquid supplying processes for supplying processing liquids to a substrate and a drying process for sweeping away the processing liquid from the substrate by centrifugal force by rotating the substrate at a high speed. However, the various processing liquid supplying process and the drying process are different in the optimal state of air flow at an upper side of the substrate.

However, in the configuration of the related art, it is difficult to change a condition in order to optimize a state of air flow at an upper side of a substrate according to each liquid process performed during a liquid processing of substrate.

SUMMARY

An exemplary embodiment of the present disclosure provides a liquid processing apparatus that performs a substrate liquid processing which includes: a support member configured to horizontally support the substrate; a rotation mechanism configured to rotate the support member; an outer circumferential part extending upward from the outer part of the support member; a liquid supply member configured to supply a processing liquid from an upper side to the substrate supported by the support member; a gap forming member disposed at an upper side of the support member and integrally rotatably connected to the support member to form an annular gap between the gap forming member and the outer circumferential part of the support member; a cup configured to receive the processing liquid swept away from the rotating substrate through the annular gap; and an elevating mechanism configured to elevate the gap forming member. In the liquid processing apparatus, the gap forming member includes a plate part and an outer circumferential part extending downward from the outer part of the plate part, the annular gap is formed between the outer circumferential part of the support member and the outer circumferential part of the gap forming member, and the elevating mechanism elevates the gap forming member during the substrate processing.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
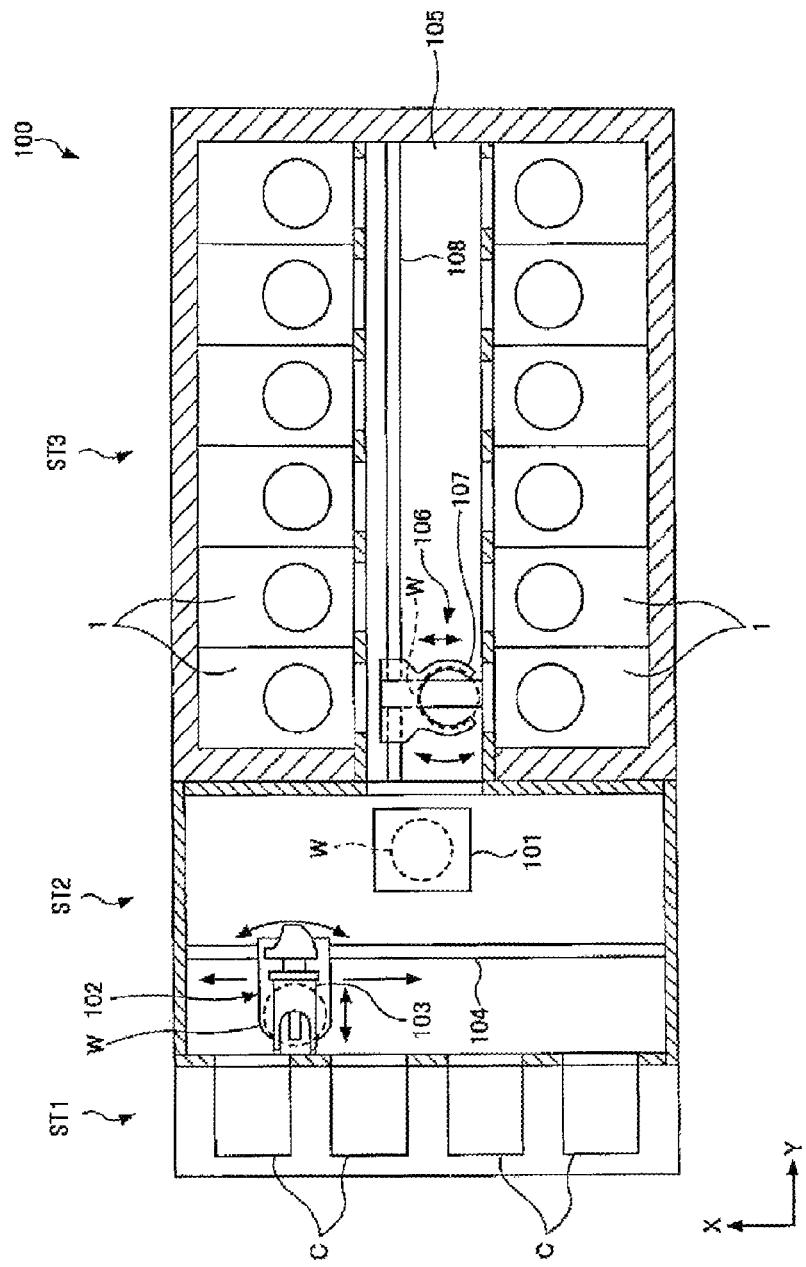
FIG. 1 is a plan view illustrating a substrate processing apparatus including a liquid processing apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a liquid processing apparatus and a liquid processing method that can optimize a state of air flow at an upper side of a substrate according to each liquid process performed during a substrate liquid processing.

A first exemplary embodiment of the present disclosure provides a liquid processing apparatus that performs a substrate liquid processing which includes: a support member configured to horizontally support the substrate; a rotation mechanism configured to rotate the support member; an outer circumferential part extending upward from the outer part of the support member; a liquid supply member configured to supply a processing liquid from an upper side to the substrate supported by the support member; a gap forming member disposed at an upper side of the support member and integrally rotatably connected to the support member to form an annular gap between the gap forming member and the outer circumferential part of the support member; a cup configured to receive the processing liquid swept away from the rotating substrate through the annular gap; and an elevating mechanism configured to elevate the gap forming member. In the liquid processing apparatus, the gap forming member includes a plate part and an outer circumferential part extending downward from the outer part of the plate part, the annular gap is formed between the outer circumferential part of the support member and the outer circumferential part of the gap forming member, and the elevating mechanism elevates the gap forming member during the substrate processing.

In the liquid processing apparatus, a guide part guiding air flow discharged outside through the annular gap is formed at an outer circumferential part of the support member.

In the liquid processing apparatus, the liquid supplying member sequentially supplies a plurality of kinds of processing liquids to the substrate, the liquid processing apparatus includes a control unit controlling the elevating mechanism, and the control unit raises or lowers the gap forming member according to the kind of processing liquids to regulate the annular gap.

Further, the liquid supplying member sequentially supplies a chemical liquid and a rinsing liquid for removing the chemical liquid to the substrate, and the annular gap for the case where the chemical liquid having a higher temperature than the rinsing liquid is supplied to the substrate is set to be narrower than the annular gap for the case where the rinsing liquid is supplied to the substrate.

In the liquid processing apparatus, the gap forming member forms a processing chamber that processes the substrate by a predetermined liquid process together with the support member and includes an opening that introduces a gas into the processing chamber, and the liquid processing apparatus further includes a moving mechanism configured to raise or lower the liquid supplying member to be approached to or be separated from the opening part of the processing chamber.

Further, the gap forming member includes a tubular duct part extending upward from an outer circumferential part of the opening, and the liquid supplying member include a disk-shaped main body part disposed to be opposed to the opening.

In addition, a diameter of the main body part is larger than a diameter of the opening having a circular shape.

The liquid processing apparatus further includes an annular partition wall configured to divide the annular gap into an upper portion and a lower portion; and a connection member configured to connect the annular partition wall and an outer circumferential part of the support member or the gap forming member. Further, a gap through which air flow passes is formed between the annular partition wall and the outer circumferential part of the support member or the gap forming member.

Further, the annular partition wall and the outer circumferential part of the support member or the gap forming member forms a labyrinth structure narrowing the air flow that flows through the gap.

A second exemplary embodiment of the present disclosure provides a liquid processing method for performing a substrate liquid processing in a liquid processing apparatus which includes: horizontally supporting the substrate by a support member; integrally rotating the support member, the substrate supported by the support member, and a gap forming member forming an annular gap between the gap forming member and an outer circumferential part of the support member; supplying a processing liquid to the substrate from a liquid supply member disposed at an upper side of the rotating substrate; receiving the processing liquid swept away from the rotating substrate in a cup through the annular gap and exhausting the inside of the cup; and raising or lowering the gap forming member relatively to the support member to regulate the annular gap, and the regulation of the annular gap is performed during the substrste processing.

In the liquid processing method for performing a substrate liquid processing in a liquid processing apparatus, a guide part guiding air flow discharged outside through the annular gap is formed at an outer circumferential part of the support member.

Further, the liquid supplying member sequentially supplies a plurality of kinds of processing liquids to the substrate, and the annular gap is regulated according to a kind of processing liquids.

Still further, the liquid supplying member sequentially supplies a chemical liquid and a rinsing liquid for removing the chemical liquid to the substrate, and the annular gap for the case where the chemical liquid having a higher temperature than the rinsing liquid is supplied to the substrate is set to be narrower than the annular gap for the case where the rinsing liquid is supplied to the substrate.

In the liquid processing method for performing a substrate liquid processing in a liquid processing apparatus, the gap forming member forms a processing chamber for processing the substrate by a predetermined liquid process together with the support member and includes an opening for introducing a gas into the processing chamber. Further, the liquid processing method further includes raising or lowering the liquid supplying member relatively to the gap forming member to be approached to or be separated from the opening of the processing chamber.

In addition, the gap forming member includes a tubular duct part extending upward from an outer circumferential part of the opening, and the liquid supplying member include a main body part disposed to be opposed to the opening.

In the liquid processing method for performing a substrate liquid processing in a liquid processing apparatus, the liquid processing apparatus further includes an annular partition wall configured to divide the annular gap into an upper portion and a lower portion; and a connection member configured to connect the annular partition wall and an outer circumferential part of the support member or the gap forming member, and a gap through which air flow passes is formed between the annular partition wall and the outer circumferential part of the support member or the gap forming member.

According to the exemplary embodiments of the present disclosure, it is possible to provide the liquid processing apparatus and the liquid processing method that can optimize the state of air flow at the upper side of the substrate according to the processes during liquid processing.

Hereinafter, exemplary embodiments of the present disclosure will be described with reference to the accompanying drawings. In each drawing, the same or corresponding components are designated with the same or corresponding reference numerals and the description thereof will be omitted.

First Exemplary Embodiment

FIG. 1 is a plan view illustrating a substrate processing apparatus including a liquid processing process according to a first exemplary embodiment of the present disclosure.

A substrate processing apparatus 100 includes a carrier station ST1 where a plurality of wafer carriers C (four in FIG. 1) accommodating a plurality of wafers W are disposed, a carrying-in and carrying-out station ST2 transferring wafer W between carrier station ST1 and a liquid processing station ST3 to be described below, and liquid processing station ST3 where a liquid processing apparatus 1 according to the first exemplary embodiment of the present disclosure is disposed.

Carrying-in and carrying-out station ST2 carries out wafer W from wafer carrier C to dispose wafer W on a stage 101 and includes a transport mechanism 102 that picks up wafer W on stage 101 and carries wafer W in wafer carrier C. Transport mechanism 102 includes a holding arm 103 holding wafer W. Transport mechanism 102 may move holding arm 103 along a guide 104 extending in a direction (X direction in the figure) where wafer carriers C are arranged. Transport mechanism 102 may move holding arm 103 in a direction (Y direction in the figure) perpendicular to the X direction and in a vertical direction and rotate holding arm 103 in a horizontal plane.

Liquid processing station ST3 includes a transport chamber 105 extending in the Y direction and a plurality of liquid processing apparatuses 1 installed at both sides of transport chamber 105. A transport mechanism 106 is installed in transport chamber 105 and includes a holding arm 107 holding wafer W. Transport mechanism 106 is installed in transport chamber 105 and may move holding arm 107 along a guide 108 extending in the Y direction. Transport mechanism 106 may move holding arm 107 in the X direction and rotate holding arm 106 in a horizontal plane. Transport mechanism 106 transports wafer W between stage 101 of carrying-in and carrying-out station ST2 and each of the liquid processing apparatuses 1.

In substrate processing apparatus 100 configured as described above, wafer W is carried out by transport mechanism 102 from wafer carrier C disposed in carrier station ST1 to be disposed on stage 101. Wafer W on stage 101 is carried in liquid processing apparatus 1 by transport mechanism 106 in liquid processing station ST3 and the surface of wafer W is subjected to liquid processing. After liquid processing, wafer W is returned to wafer carrier C through a reverse route (sequence) to the case of carrying in. While one wafer W is subjected to liquid processing, another wafer W is transported to another liquid processing apparatus 1 in sequence to be subjected to liquid processing. As a result, wafers W may be liquid-processed with high throughput.

Figure 2:
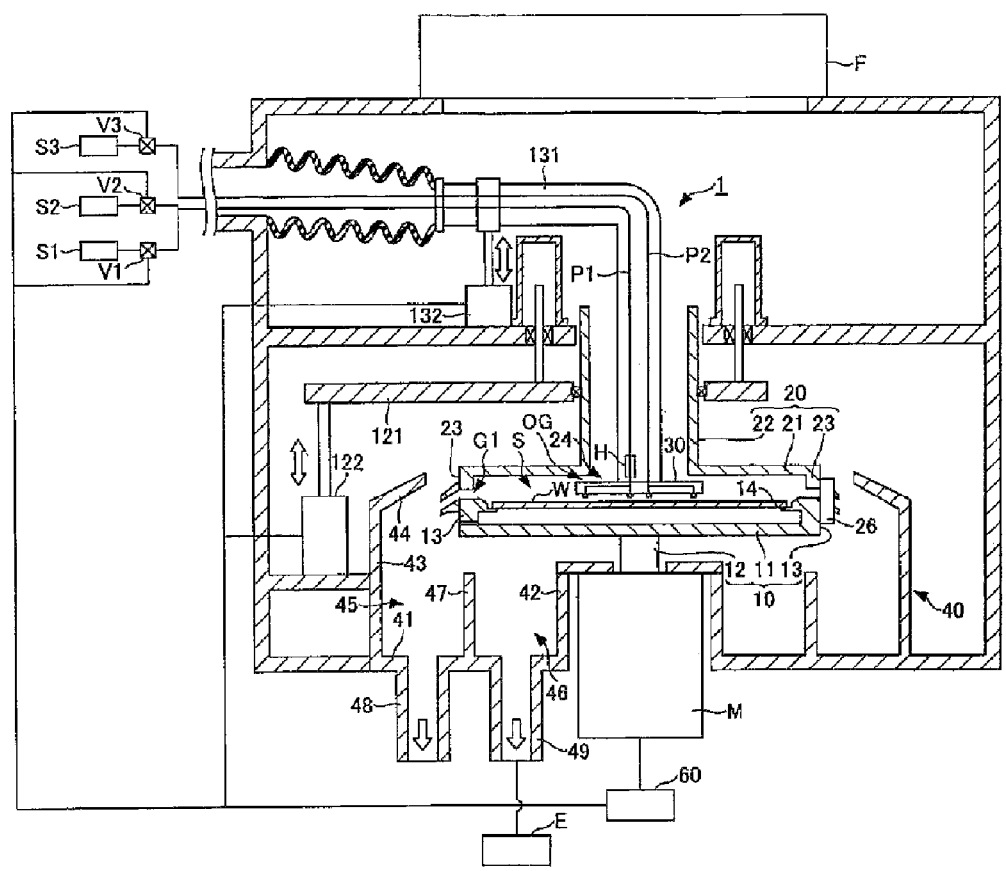
FIG. 2 is a cross-sectional view illustrating a liquid processing apparatus according to the first exemplary embodiment.
Figure 3:
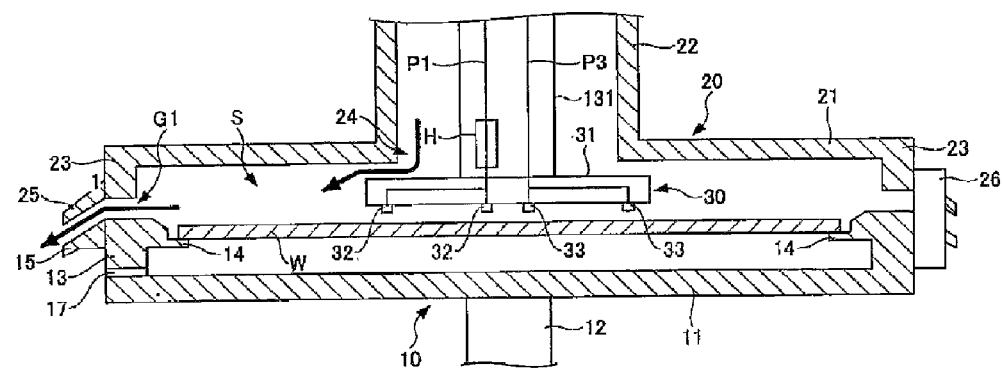
FIG. 3 is a cross-sectional view illustrating the main parts of FIG. 2.
Figure 4:
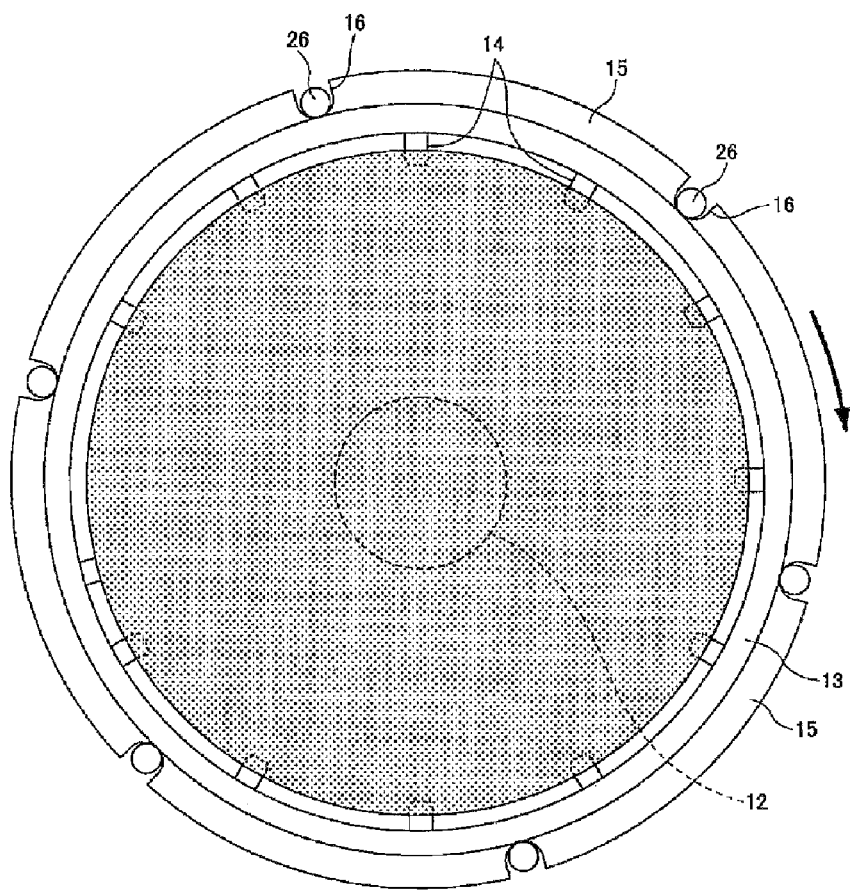
FIG. 4 is a plan view illustrating a positional relationship between a wafer support member 10 and a connection pin 26 of a cover.

FIG. 2 is a cross-sectional view illustrating the liquid processing apparatus according to the first exemplary embodiment of the present disclosure. FIG. 3 is a cross-sectional view illustrating the main parts of FIG. 2. FIG. 4 is a plan view illustrating a positional relationship between a wafer support member 10 and a connection pin 26 of a cover.

Liquid processing apparatus 1 includes a wafer support member 10 horizontally supporting wafer W, a motor M rotating wafer support member 10, and a cover 20 integrally rotatably connected to wafer support member 10 to form a processing chamber S for liquid processing wafer W together with wafer support member 10. Liquid processing apparatus 1 includes an upper liquid supplying member 30 supplying a processing liquid to wafer W from an upper side in processing chamber S and a cup 40 surrounding an annular gap G1 which is formed between an outer circumferential part 13 of wafer support member 10 and an outer circumferential part 23 of cover 20. The inside of cup 40 is exhausted, for example, by an exhaust mechanism E installed as a factory equipment. A flow rate of gas exhausted from liquid processing apparatus 1 by exhaust mechanism E is uniform.

In liquid processing apparatus 1, motor M rotates wafer support member 10 and cover 20 or wafer W while wafer support member 10 and cover 20 form processing chamber S. Upper liquid supplying member 30 supplies a processing liquid to the rotating wafer W from the upper side. The processing liquid supplied to rotating wafer W is swept away outside wafer W by centrifugal force and thus recovered in cup 40 through annular gap G1. In this case, the inside of cup 40 is exhausted by exhausting mechanism E to form air flow toward cup 40 from an upper space of wafer W in processing chamber S through annular gap G1. The air flow serves to discharge the processing liquid into cup 40. Hereinafter, respective components of liquid processing apparatus 1 will be described.

Wafer support member 10 supports wafer W horizontally and is rotatable together with wafer W. Wafer support member 10 includes a plate-shaped plate part 11 that is horizontally disposed, a rotation axis part 12 attached to a lower surface of plate part 11, and a tubular outer circumferential part 13 extending upward from an outer edge of plate part 11. Outer circumferential part 13 is formed, for example, in a cylindrical shape and has an inner diameter slightly larger than an outer diameter of wafer W.

As shown in FIG. 4, a click part 14 extending inward is formed on outer circumferential part 13 of wafer support member 10. A plurality of click parts 14 (12 in FIG. 4) are formed at predetermined intervals along an inner edge of outer circumferential part 13. Click parts 14 are in contact with a circumferential edge of a lower surface of wafer W to horizontally support wafer W. An upper surface of wafer W supported by click parts 14 and an upper surface of outer circumferential part 13 are positioned on substantially the same plane.

As shown in FIG. 3, at a side of outer circumferential part 13 of wafer support member 10, a guide part 15 guiding air flow extends so as to be inclined downward toward the outside. Guide part 15 has a substantially annular shape and a plurality of notched portions (six in FIG. 4) are formed at predetermined intervals in guide part 15. When connection pins 26 of cover 20 to be described below are inserted into notched portions 16, cover 20 and wafer support member 10 become integrally rotatable.

As shown in FIG. 2, cover 20 is integrally rotatably connected to wafer support member 10 and covers an upper side of wafer support member 10 to form processing chamber S for processing wafer W by a predetermined liquid process together with wafer support member 10. Since processing chamber S is substantially sealed, liquid processing may be stably performed. Since wafer support member 10 and cover 20 which constitute a wall surface of processing chamber S rotate integrally with wafer W, it is difficult for a processing liquid dispersed from wafer W to hit the wall surface of processing chamber S and bounce back.

Cover 20 includes an annular plate part 21 having an opening 24 that introduces a gas into processing chamber S, a tubular duct part 22 extending upward from an outer circumferential part of opening 24 [inner circumferential part of plate part 21], and a tubular outer circumferential part 23 extending downward from an outer edge of plate part 21. A plurality of connection pins 26, which may be inserted into and drawn out from the plurality of notched portions 16, are fixed to outer circumferential part 23. Connection pins 26 are attached to a guide part 25 to be described below at positions corresponding to notched portions 16.

Duct part 22 of cover 20 has a cylindrical shape and a gas supplying mechanism F such as a fan filter unit (FFU) is installed at an upper side of duct part 22. A flow rate of a gas supplied to liquid processing apparatus 1 by gas supplying mechanism F is uniform and is substantially the same as a flow rate of a gas discharged from liquid processing apparatus 1 by exhaust mechanism E. In the exemplary embodiment of the present disclosure, as described above, an outflow rate and an inflow rate of gas for liquid processing apparatus 1 are uniformly maintained and then a state (including flow rate and flow velocity) of air flow at an upper side of wafer W which is subjected to liquid processing in processing chamber S is optimized.

The gas of which impurities are removed in gas supplying mechanism F forms a down-flow in duct part 22 and is introduced to processing chamber S through opening 24 of plate part 21 which is horizontally disposed. As shown in FIG. 3, the gas passes through the upper side of wafer W and is discharged outside from processing chamber S through an annular gap G1 which will be described below. The flow rate of gas introduced to processing chamber S is mainly determined by a flow rate of gas discharged from processing chamber S through annular gap G1 and a flow rate of gas discharged from processing chamber S is determined by a size of annular gap G1.

Outer circumferential part 23 of cover 20 is formed, for example, in a tubular shape and has an inner diameter slightly larger than an outer diameter of wafer W. An annular gap G1 is formed between outer circumferential part 23 and an outer circumferential part of wafer support member 10. Annular gap G1 has a shape conforming to an outer circumference 13 of wafer W supported by wafer support member 10.

As shown in FIG. 3, at one side of outer circumferential part 23 of cover 20, a guide part 25 guiding air flow extends so as to be inclined downward toward the outside. Air flow passing through annular gap G1 is guided to be inclined downward toward the outside by guide part 25 and guide part 15 of wafer support member 10.

As shown in FIG. 2, cover 20 is connected to a cover elevating mechanism 122 through a cover support member 121 and is movable vertically by cover elevating mechanism 122. When wafer W is carried in liquid processing apparatus 1, cover is raised up to a standby position by cover elevating mechanism 122 such that connection pins 26 come out from notched portion 16. When wafer W is supported by wafer support member 10, cover 20 is lowered by cover elevating mechanism 122 such that connection pins 26 are inserted into notched portions 16. As a result, wafer support member 10 and cover 20 are integrally rotatably connected.

Cover elevating mechanism 122 serves to regulate annular gap G1 while cover 20 and wafer support member 10 are integrally rotatably connected to form processing chamber S. When cover elevating mechanism 122 moves cover 20 upward, cover 20 is separated from wafer support member 10 to widen annular gap G1. Meanwhile, when cover elevating mechanism 122 moves cover 20 downward, cover 20 approaches wafer support member 10 to thereby narrow annular gap G1. The state (including flow velocity and flow rate) of air flow discharged outside from processing chamber S through annular gap G1 may be regulated by regulating annular gap G1.

Motor M rotatably holds rotation axis part 12 of wafer support member 10. When motor M operates, wafer support member 10, wafer W supported by wafer support member 10, and cover 20 connected to wafer support member 10 integrally rotate.

Upper liquid supplying member 30 is disposed at an upper side of wafer W supported by wafer support member 10 in processing chamber S to supply the processing liquid to wafer W from the upper side. Upper liquid supplying member 30, as shown in FIG. 3, has a disk-shaped main body part 31 having a diameter larger than a diameter of a circular opening 24. Main body part 31 is disposed to be opposed to duct part 22 (opening 24) and serves to change a direction of the air flow so that a liquid film of the processing liquid formed on wafer W is not disturbed by the air flow introduced into processing chamber S through opening 24.

As shown in FIG. 2, upper liquid supplying member 30 is connected to liquid supply sources S1 and S2 through a pipe P1 having valves V1 and V2 installed at the middle thereof. Liquid supply source S1 supplies a chemical liquid and liquid supply source S2 supplies a rinsing liquid for rinsing off the chemical liquid. The chemical liquid and the rinsing liquid are switchably supplied toward wafer W from a nozzle 32 (see FIG. 3). The supply amount thereof may be regulated by regulating the opening degree of valves V1 and V2.

In a cleaning process of wafer W, as the chemical liquid, for example, SPM ($H_2SO_4+H_2O_2$), SC1 ($NH_4OH+H_2O_2+H_2O$), SC2 ($HCl+H_2O_2+H_2O$) or diluted hydrofluoric acid (DHF) is used. A plurality of kinds of chemical liquids may be used and a plurality of liquid supply sources S1 may be installed. As the rinsing liquid, for example, deionized water (DIW) is used.

In an etching process, hydrofluoric acid (HF), buffered hydrofluoric acid (BHF), or nitric acid ($HNO_3$) may be used as a processing liquid.

In a developing process, a developing liquid is used as a chemical liquid.

Nozzle 32 may be protruded downward from main body part 31 or be buried inside main body part 31. Nozzle 32 is opened toward wafer W supported by wafer support member 10 to supply the chemical liquid or the rinsing liquid onto the upper surface of wafer W. A plurality of nozzles 32 (only two are shown in FIG. 3) are installed at predetermined intervals in a diameter direction of wafer W. The number of installed nozzles 32 may be one.

Regardless of the number of installed nozzles 32, a single nozzle 32 is opened toward a central portion of wafer W to supply the processing liquid or the rinsing liquid. The processing liquid supplied to the central portion of wafer W is expanded outward to form a liquid film.

A heating unit H heating the chemical liquid to a predetermined temperature is installed around an outlet of pipe P1 connecting liquid supply source S1 and upper liquid supplying member 30 in order to enhance the processing capability of the chemical liquid. Heating unit H may be installed in liquid supply source S1.

Upper liquid supplying member 30 is connected to a liquid supply source S3 through a pipe P3 having a valve V3 installed at the middle thereof. Liquid supply source S3 supplies onto upper liquid supplying member 30 alcohol such as isopropyl alcohol (IPA) as a liquid for drying the rinsing liquid. A drying solvent is supplied toward wafer W from nozzle 33 (see FIG. 3) of upper liquid supplying member 30. The supply amount thereof may be regulated by regulating the opening degree of valve V3.

Nozzle 33 may be protruded downward from main body part 31 and be buried inside main body part. Nozzle 33 is opened toward wafer W supported by wafer support member 10 to supply the drying solvent onto the upper surface of wafer W. A plurality of nozzles 33 (only two are shown in FIG. 3) are installed at predetermined intervals in a diameter direction of wafer W. The number of installed nozzle 33 may be one.

Regardless of the number of installed nozzle 33, a single nozzle 33 is opened toward a central portion of wafer W to supply the drying solvent to the central portion of wafer W. The processing liquid supplied to the central portion of wafer W is expanded toward the outside to form a liquid film.

Upper liquid supplying member 30 is connected to an upper liquid supplying member elevating mechanism 132 through support member 131 to be movable vertically by upper liquid supplying member elevating mechanism 132. When wafer W is carried in and carried out of liquid processing apparatus 1, upper liquid supplying member 30 is raised up to a standby position by upper liquid supplying member elevating mechanism 132 such that wafer W is supported by wafer support member 10. Thereafter, upper liquid supplying member 30 is lowered by upper liquid supplying member elevating mechanism 132 and stops at a position where the processing liquid is supplied to wafer W.

Upper liquid supplying member elevating mechanism 132 raises or lowers upper liquid supplying member 30 while wafer support member 10 and cover 20 form processing chamber S, such that upper liquid supplying member 30 approaches or is separated from plate part 21 of cover 20. Therefore, it is possible to regulate the state (flow rate, flow velocity, direction) of air flow introduced into processing chamber S through opening 24 of plate part 21.

The processing liquid supplied to wafer W from upper liquid supplying member 30 is swept away outside wafer W by centrifugal force and recovered in cup 40 together with the air flow passing through annular gap G1. The processing liquid that lands on plate part 11 of wafer support member 10 is discharged by centrifugal force from an outlet 17 (see FIG. 3) formed at outer circumferential part 13 of wafer support member 10 and recovered in cup 40.

Cup 40 includes an annular plate part 41, a cylindrical inner wall part 42 extending upward from an inner edge of plate part 41, and a cylindrical outer wall part 43 extending upward from an outer edge of plate part 41. Outer wall part 43 surrounds annular gap G1 and an annular awning part 44 extends so as to be inclined upward toward the inside from an upper end of outer wall part 43.

Cup 40 includes a cylindrical partitioning part 47 partitioning a lower space in cup 40 into an outer annular space 45 and an inner annular space 46 in order to separate the processing liquid from air flow. A liquid discharging pipe 48 discharging the processing liquid outside is connected to outer annular space 45. An exhaust mechanism E is connected to inner annular space 46 through an exhaust pipe.

In this case, exhaust mechanism E is constituted by a vacuum pump and exhausting the inside of cup 40 to form air flow flowing from an upper space of wafer W in processing chamber S toward outer wall part 43 of cup 40 through annular gap G1. The air flow serves to discharge the processing liquid swept away from rotating wafer W into cup 40.

The predetermined apparatuses constituting liquid processing apparatus 1 (e.g., motor M, valves V1 to V3, cover elevating mechanism 122, and upper liquid supplying member elevating mechanism 132) are connected to a control unit 60 controlling an operation of liquid processing apparatus 1 through a signal line, as shown in FIG. 2. Control unit 60 is constituted by a computer including a CPU and a recording medium. Control unit 60 allows the CPU to execute various programs stored in the recording medium to control the apparatus connected through the signal line and perform various operations of liquid processing apparatus 1 to be described below.

Next, the operation of the liquid processing apparatus (liquid processing method) configured as described above will be described.

First, when cover elevating mechanism 122 raises cover 20 up to a standby position and upper liquid supplying member elevating mechanism 132 raises upper liquid supplying member 30 up to a standby position, wafer W held by holding arm 107 of transport mechanism 106 shown in FIG. 1 is carried in liquid processing apparatus 1. When wafer W is transferred to wafer support member 10 and holding arm 107 retreats from liquid processing apparatus 1, upper liquid supplying member 30 is lowered up to a position around the upper surface of wafer W by upper liquid supplying member elevating mechanism 132. Cover 20 is lowered by cover elevating mechanism 122 and connection pins 26 of cover 20 are inserted into notched portions 16 of wafer support member 10, such that cover 20 and wafer support member 10 are integrally rotatably connected. Cover 20 covers an upper side of wafer support member 10 to form processing chamber S for processing wafer W by a predetermined liquid process together with wafer support member 10. Subsequently, motor M integrally rotates wafer support member 10, cover 20, and wafer W.

Then, the processing liquid is supplied from upper liquid supplying member 30 onto the upper surface of rotating wafer W. Specifically, for example, a chemical liquid (for example, SPM) from nozzle of upper liquid supplying member 30 is supplied to wafer W for a predetermined time. Subsequently, a rinsing liquid rinsing the chemical liquid off is supplied to wafer W from nozzle 32 of upper liquid supplying member 30 for a predetermined time. Thereafter, a drying solvent (for example, IPA) is discharged toward the upper surface of wafer W from nozzle 33 of upper liquid supplying member 30. After the supply of drying solvent is stopped, wafer W is rotated at a high speed and thus the rinsing liquid is swept away by centrifugal force. Then, the rotation of wafer W stops.

Here, the processing liquid swept away from rotating wafer W is recovered in cup 40 through annular gap G1 formed between outer circumferential part 13 of wafer support member 10 and outer circumferential part 23 of cover 20. Exhausting mechanism E exhausts the inside of cup 40 to form air flow toward cup 40 from an upper space of wafer W in processing chamber S through annular gap G1. The air flow serves to discharge the processing liquid swept away from rotating wafer W into cup 40.

Finally, wafer W is carried out from liquid processing apparatus 1 in reverse sequence to the case where wafer W is carried in liquid processing apparatus 1, and liquid processing of wafer W is completed.

In the exemplary embodiment of the present disclosure, wafer support member 10 and cover 20 form processing chamber S for processing wafer W by a predetermined liquid process. Since processing chamber S is almost sealed, liquid processing may be stably performed. Since wafer support member 10 and cover 20 which constitute a wall surface of processing chamber S rotate integrally with wafer W it is difficult for a processing liquid dispersed from wafer W to hit the wall surface of processing chamber S and bounce back.

In the exemplary embodiment of the present disclosure, annular gap G1 is regulated according to processes performed during liquid processing of wafer W. Therefore, the state of air flow discharged outside from processing chamber S may be optimized through annular gap G1. In the case where the amount exhausted by exhaust mechanism E is uniform, as annular gap G1 is widened, the flow amount of air flow passing through annular gap G1 is increased. The regulation of annular gap G1 is implemented by, for example, raising or lowering cover 20 by cover elevating mechanism 122.

In the exemplary embodiment of the present disclosure, the regulation of annular gap G1 is implemented by raising or lowering cover 20, but may be implemented by either lowering or raising wafer support member 10 or moving both cover 20 and wafer support member 10.

In the exemplary embodiment of the present disclosure, according to the processes during liquid processing of wafer W, upper liquid supplying member 30 approaches or is separated from cover 20, such that a gap OG (see FIG. 2) formed between main body part 31 of upper liquid supplying member 30 and plate part 21 of cover 20 is regulated. Therefore, it is possible to optimize the state of air flow introduced into processing chamber S through opening 24 of plate part 21. When the flow rate of air flow introduced into processing chamber S is uniform (that is, when the flow rate of air flow discharged from processing chamber S is uniform), as opening 24 and upper liquid supplying member 30 get closer to each other, that is, gap OG becomes narrower, the air flow is narrowed, such that the flow velocity of air flow becomes faster. The approaching or separation of opening 24 and upper liquid supplying member 30 is implemented, for example, by raising or lowering upper liquid supplying member 30 by upper liquid supplying member elevating mechanism 132.

Subsequently, an example of the regulation of gap OG and annular gap G1 will be described. In this example, the chemical liquid, the rinsing liquid, and the drying solvent are supplied to rotating wafer W in this order and thereafter, wafer W is rotated at a high speed in order to sweep away the drying solvent, which will be described below.

First, in a process of supplying SPM that is a chemical liquid, since the SPM is used at a higher temperature than that of other chemical liquid, fumes may easily be generated at the upper side of rotating wafer W. Therefore, in order to prevent the generated fumes from reversely flowing upward through opening 24, gap OG is set to be narrower than a predetermined reference size.

In a process of supplying SPM, wafer W is rotated at a low speed in order to prevent SPM from being cooled due to swirling air flow generated around rotating wafer W. In this state, annular gap G1 is set to be narrower than a predetermined reference in order to efficiently discharge the fumes outside from annular gap G1. This is because when annular gap G1 is narrowed, the flow velocity of air flow passing through annular gap G1 is increased, and as a result, the air flow toward the outside from processing chamber S through annular gap G1 is stabilized.

In a subsequent process of supplying a rinsing liquid, the size of each gap OG and annular gap G1 is restored to the reference size in order to rapidly substitute an atmosphere in processing chamber S from the atmosphere including the chemical liquid to a clean atmosphere.

In a subsequent process of supplying IPA that is a drying solvent, it becomes important to increase a concentration of IPA in processing chamber S in order to improve efficiency of substituting the rinsing liquid with IPA. Therefore, gap OG and annular gap G1 are set to be narrower as compared to the case where SPM is supplied.

Finally, in a process of rotating and drying wafer W at a high speed and, gap OG and annular gap G1 are returned to reference sizes, respectively, in order to rapidly substitute the atmosphere in processing chamber S.

In a process of supplying DHF that is a chemical liquid, an oxide film of wafer W is removed by DHF and thus wafer W is hydrophobized. For this reason, wafer W needs to be rotated at a high speed so as to form an excellent liquid film, which causes the swirling airflow generated around wafer W to be faster. In order to discharge the high-speed swirling airflow outside from annular gap G1, annular gap G1 is set to a reference size. In a process of supplying DHF, gap OG is set to be narrower than a reference in order to prevent the chemical liquid from reversely flowing upward from opening 24.

As described above, annular gap G1 and/or gap OG are regulated according to the process for processing wafer W by a predetermined liquid in the exemplary embodiment of the present disclosure. Therefore, the states of air flow introduced into and discharged from processing chamber S may be optimized and the state of air flow at an upper side of wafer W may be optimized.

The regulation of annular gap G1 and gap OG may be performed during rotation of wafer W or before the rotation.

First Modified Example

Figure 5:
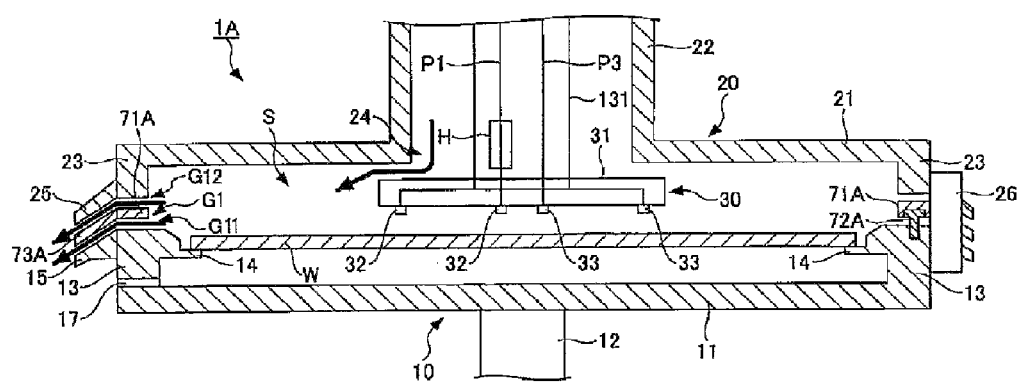
FIG. 5 is a cross-sectional view illustrating the main parts of a liquid processing apparatus according to a first modified example.

FIG. 5 is a cross-sectional view illustrating the main parts of a liquid processing apparatus according to a first modified example.

As shown in FIG. 5, a liquid processing apparatus 1A has an annular partition wall 71A vertically partitioning an annular gap G1. A guide part 73A guiding air flow extends from an outer circumferential part of partition wall 71A so as to be inclined downward toward the outside with respect to a processing chamber S.

Liquid processing apparatus 1A includes a connection member 72A that connects partition wall 71A and outer circumferential part 13 of wafer support member 10. A plurality of connection members 72A are installed at predetermined intervals in a circumferential direction of annular gap G1.

A gap G11 through which processing chamber S communicates with the outside is formed between outer circumferential part 13 of wafer support member 10 and partition wall 71A. Air flow passing through gap G11 is guided to be inclined downward toward the outside with respect to processing chamber S by guide part 73A of partition wall 71A and a guide part 15 of wafer support member 10.

A gap G12 through which processing chamber S communicates with the outside is formed between outer circumferential part 23 of cover 20 and partition wall 71A. The air flow passing through gap G12 is guided to be inclined downward toward the outside by guide part 73A of partition wall 71A and guide part 25 of cover 20.

Cover 20 is connected to cover elevating mechanism 122 through cover support member 121, as shown in FIG. 2. Therefore, an upper gap G12 of annular gap G1 can be regulated by elevating cover 20 by cover elevating mechanism 122. Therefore, the state of air flow toward cup 40 from an upper space of wafer W inside processing chamber S through annular gap G1 may be optimized.

In the modified example, since a lower gap G11 is not changed when annular gap G1 is regulated, a predetermined amount of a gas or processing liquid or more than may be discharged outside from processing chamber S through annular gap G1.

In the modified example, connection members 72A connect partition wall 71A and outer circumferential part 13 of wafer support member 10, but may connect partition wall 71A and outer circumferential part 23 of cover 20. In this case, lower gap G11 of annular gap G1 is changed by elevating cover 20.

Second Modified Example

Figure 6:
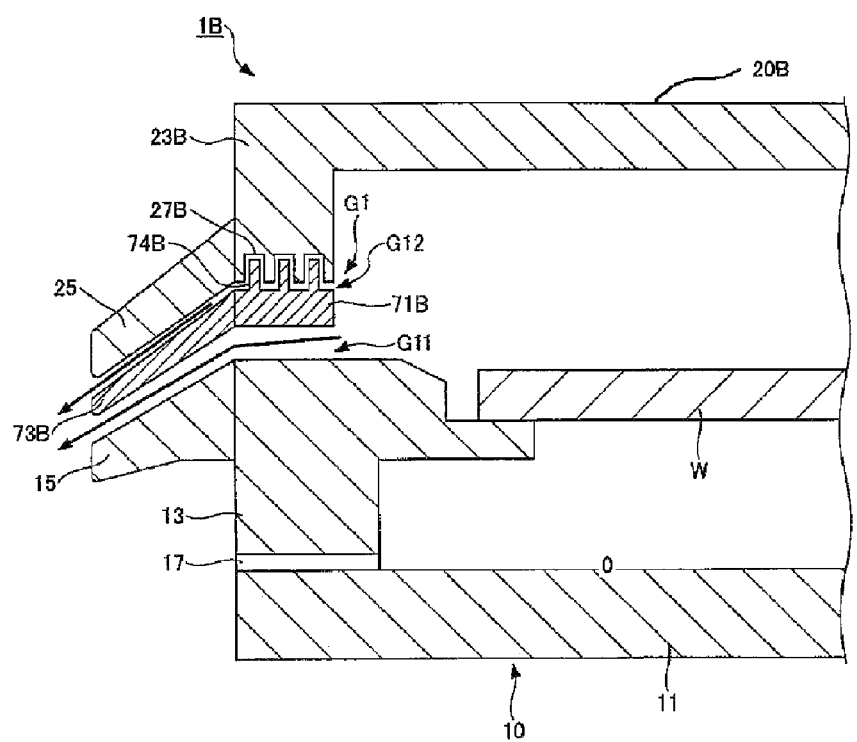
FIG. 6 is an enlarged cross-sectional view illustrating an annular gap of a liquid processing apparatus according to a second modified example.

FIG. 6 is an enlarged cross-sectional view illustrating an annular gap of a liquid processing apparatus according to a second modified example.

Similar to the first modified example, a liquid processing apparatus 1B has an annular partition wall 71B vertically partitioning an annular gap G1. A guide part 73B guiding air flow extends from an outer circumferential part of partition wall 71B so as to be inclined downward toward to the outside with respect to processing chamber S.

Similar to the first modified example, liquid processing apparatus 1B includes a connection member (not shown) that connects a partition wall 71B and wafer support member 10. A plurality of connection members are installed at predetermined intervals in a circumferential direction of annular gap G1.

In the second modified example, partition wall 71B and an outer circumferential part 23B of a cover 20B form a labyrinth structure narrowing air flow that flowing through gap G12.

For example, an annular protrusion 74B is formed on the upper surface of partition wall 71B and an annular groove 27B is formed on the lower surface of outer circumferential part 23B. Front end portion of annular protrusion 74B are inserted into annular groove 27B and separated from wall surface of annular groove 27B to form a labyrinth structure together with annular groove 27B. A plurality of (three in FIG. 6) annular protrusions 74B and annular grooves 27B are formed in a concentric shape, respectively.

Since the labyrinth structure narrows the air flow that flows through gap G12, the labyrinth structure is effective for a process performed during a substrate liquid processing, in which an outflow rate of the air flow discharged outside from processing chamber S is small, for example, a liquid processing process that sets the inside of processing chamber S with nitrogen atmosphere.

In the modified example, partition wall 71B and outer circumferential part 23B of cover 20B form the labyrinth structure, but partition wall 71B and outer circumferential part 13 of wafer support member 10 may form a labyrinth structure. The labyrinth structure may be applied to the annular gap in liquid processing apparatus 1 shown in FIG. 2 and the like and outer circumferential part 13 of wafer support member 10 and outer circumferential part 23 of cover 20 may form a labyrinth structure.

Third Modified Example

Figure 7:
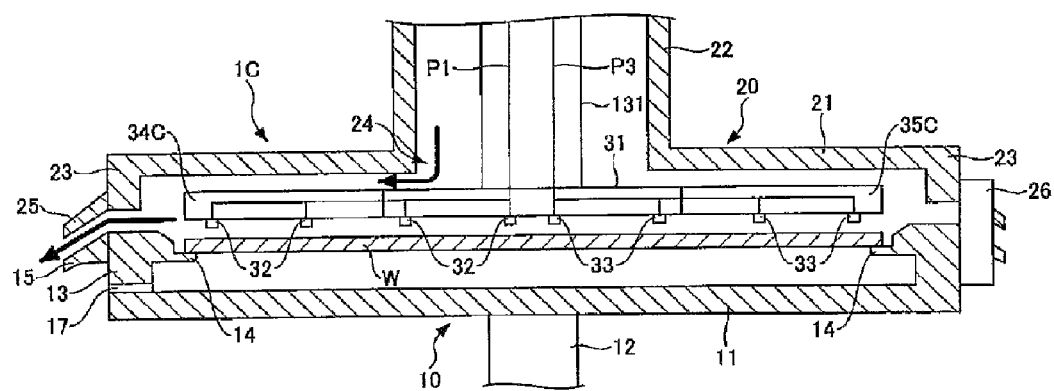
FIG. 7 is a cross-sectional view illustrating the main parts of a liquid processing apparatus according to a third modified example.
Figure 8:
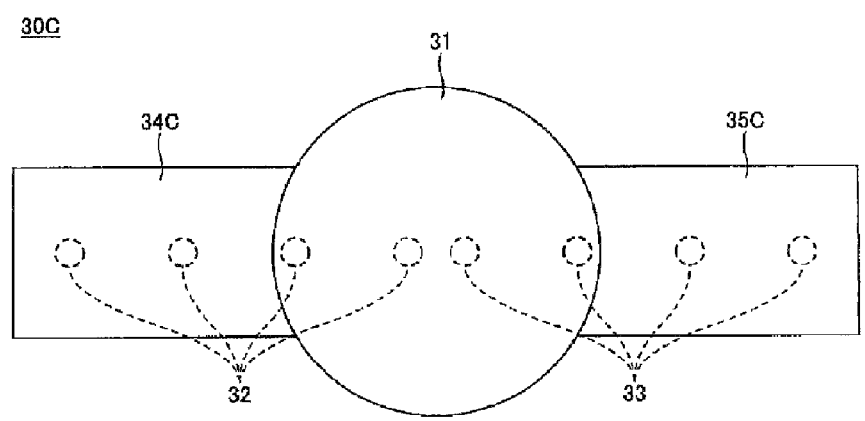
FIG. 8 is a plan view illustrating an upper liquid supplying member 30C.

FIG. 7 is a cross-sectional view illustrating the main parts of a liquid processing apparatus according to a third modified example. FIG. 8 is a plan view illustrating an upper liquid supplying member 30C.

A configuration of an upper liquid supplying member of a liquid processing apparatus 1C has a different configuration different from that of liquid processing apparatus 1 shown in FIG. 2. Components other than an upper liquid supplying member 30C are the same, and thus, a description thereof is omitted.

As shown in FIG. 7 and FIG. 8, upper liquid supplying member 30C further includes two extensions 34C and 35C extending from an outer circumferential surface of a main body part 31. Extensions 34C and 35C extend in parallel with a diameter direction of wafer W and each front end thereof is positioned at an upper side of an outer edge of wafer W. In extensions 34C and 35C, a plurality of nozzles 32 and 33 are installed at predetermined intervals in an extending direction. Therefore, the processing liquid can be uniformly supplied from a central portion of wafer W up to an outer edge thereof.

Fourth Modified Example

Figure 9:
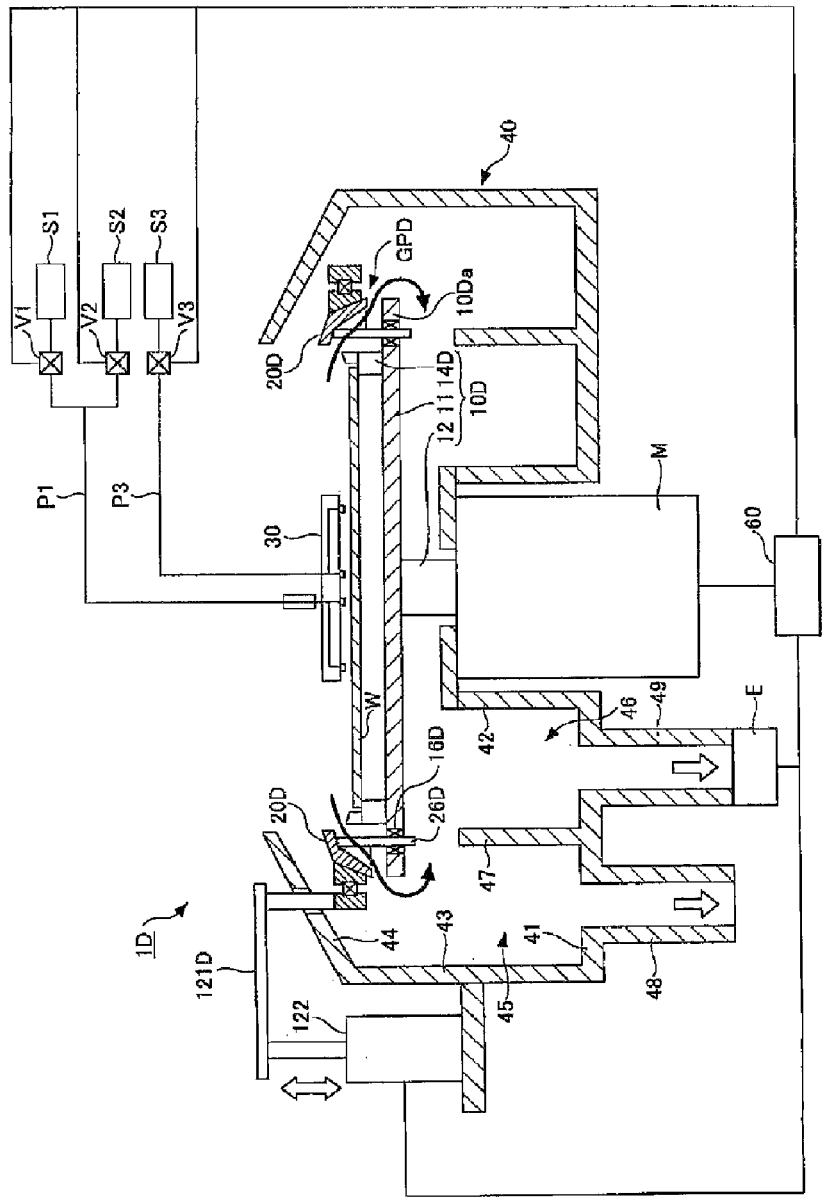
FIG. 9 is a cross-sectional view illustrating a liquid processing apparatus according to a fourth modified example.

FIG. 9 is a cross-sectional view illustrating a liquid processing apparatus according to a fourth modified example.

A liquid processing apparatus 1D includes a wafer support member 10D which supports wafer W horizontally and is rotatable together with wafer W and a gap forming member 20D that is integrally rotatably connected to wafer support member 10D to form an annular gap GPD between gap forming member 20D and an outer circumferential part 10Da of wafer support member 10D.

In liquid processing apparatus 1D, a motor M rotates wafer support member 10D, and gap forming member 20D or wafer W. Upper liquid supplying member 30 supplies a processing liquid to rotating wafer W from the upper side. The processing liquid supplied to rotating wafer W is swept away outside wafer W by centrifugal force and thus recovered in cup 40 through annular gap GPD. In this case, an exhaust mechanism E exhausts the inside of cup 40 to thereby form air flow from an upper space of wafer W toward cup 40 through annular gap GPD. The air flow serves to recover the processing liquid in cup 40. Hereinafter, respective components of liquid processing apparatus 1D will be described, but components other than wafer support member 10D and gap forming member 20D are the same as those of FIG. 2, and thus, a description thereof is omitted.

Wafer support member 10D is a member that supports wafer W horizontally and is rotatable together with wafer W. Wafer support member 10 includes a plate-shaped plate part 11 that is horizontally disposed, a rotation axis part 12 attached to a lower surface of plate part 11, and a click part 14D attached to an upper surface of plate part 11.

Click part 14D extends upward from plate part 11 and is in contact with a circumferential edge of a lower surface of wafer W at a front end portion to horizontally support wafer W. At the front end portion of click part 14D, a stepped portion having substantially the same height as a thickness of wafer W is formed and a circumferential edge of a lower surface of wafer W is in contact with a lower portion thereof. A plurality of click parts 14D are formed at predetermined intervals in a circumferential direction of plate part 11.

At an outer circumferential part of plate part 11, a plurality of connection holes 16D that are in parallel with a rotation axis part 12 are formed at predetermined intervals in a circumferential direction of plate part 11. In the plurality of connection holes 16D, a plurality of connection pins 26D attached to a lower surface of gap forming member 20D are supported to be movable vertically and wafer support member 10D and gap forming member 20D are integrally rotatably connected.

Gap forming member 20D is a member that is disposed at an upper side of wafer support member 10D and is integrally rotatably connected to wafer support member 10D to form an annular gap GPD between the gap forming member 20D and outer circumferential part 10Da of wafer support member 10D.

Gap forming member 20D is annularly formed to surround an outer circumference of wafer W supported by wafer support member 10D. Gap forming member 20D has an inner diameter slightly larger than an outer diameter of wafer W. Therefore, the entire upper surface of wafer W is opened upward and a gas from which impurities are removed by a gas supplying mechanism such as a fan filter unit is supplied to the entire upper surface of wafer W as a down-flow.

Gap forming member 20D is inclined downward as it goes outside to guide the processing liquid swept away from rotating wafer W and the air flow conveying the processing liquid to be inclined downward, thereby leading the processing liquid and the air flow into cup 40.

Gap forming member 20D is connected to an elevating mechanism 122 through a support member 121D that rotatably supports gap forming member 20D about an extension line of rotation axis part 12 and is vertically movable by elevating mechanism 122.

Elevating mechanism 122 serves to regulate annular gap GPD by raising or lowering gap forming member 20D. When elevating mechanism 122 moves gap forming member 20D upward, annular gap GPD is widened. Meanwhile, when elevating mechanism 122 moves gap forming member 20D downward, annular gap GPD is narrowed. The state (including flow velocity and flow) of air flow flowing toward the outside from the inside through annular gap GPD may be regulated by regulating annular gap GPD.

Therefore, similar to liquid processing apparatus 1 shown in FIG. 2, according to the process for processing wafer W by a predetermined liquid, the state of the air flow at an upper side of wafer W may be optimized by regulating annular gap GPD. The optimization of the state of the air flow may be performed during rotation of wafer W or before the rotation.

Liquid processing apparatus 1D may have an annular partition wall vertically partitioning annular gap GPD, similar to the first modified example, or have a labyrinth structure, similar to the second modified example.

Second Exemplary Embodiment

The same description as in the first exemplary embodiment is omitted.

Figure 10:
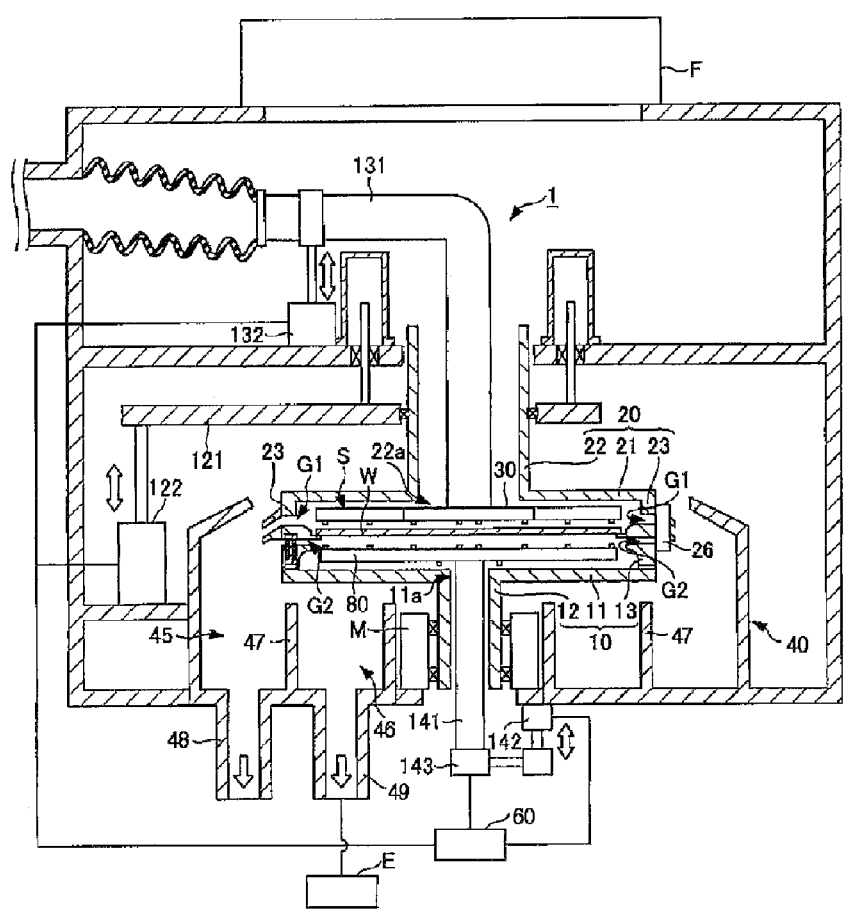
FIG. 10 is a cross-sectional view illustrating a liquid processing apparatus according to a second exemplary embodiment of the present disclosure.
Figure 11A:
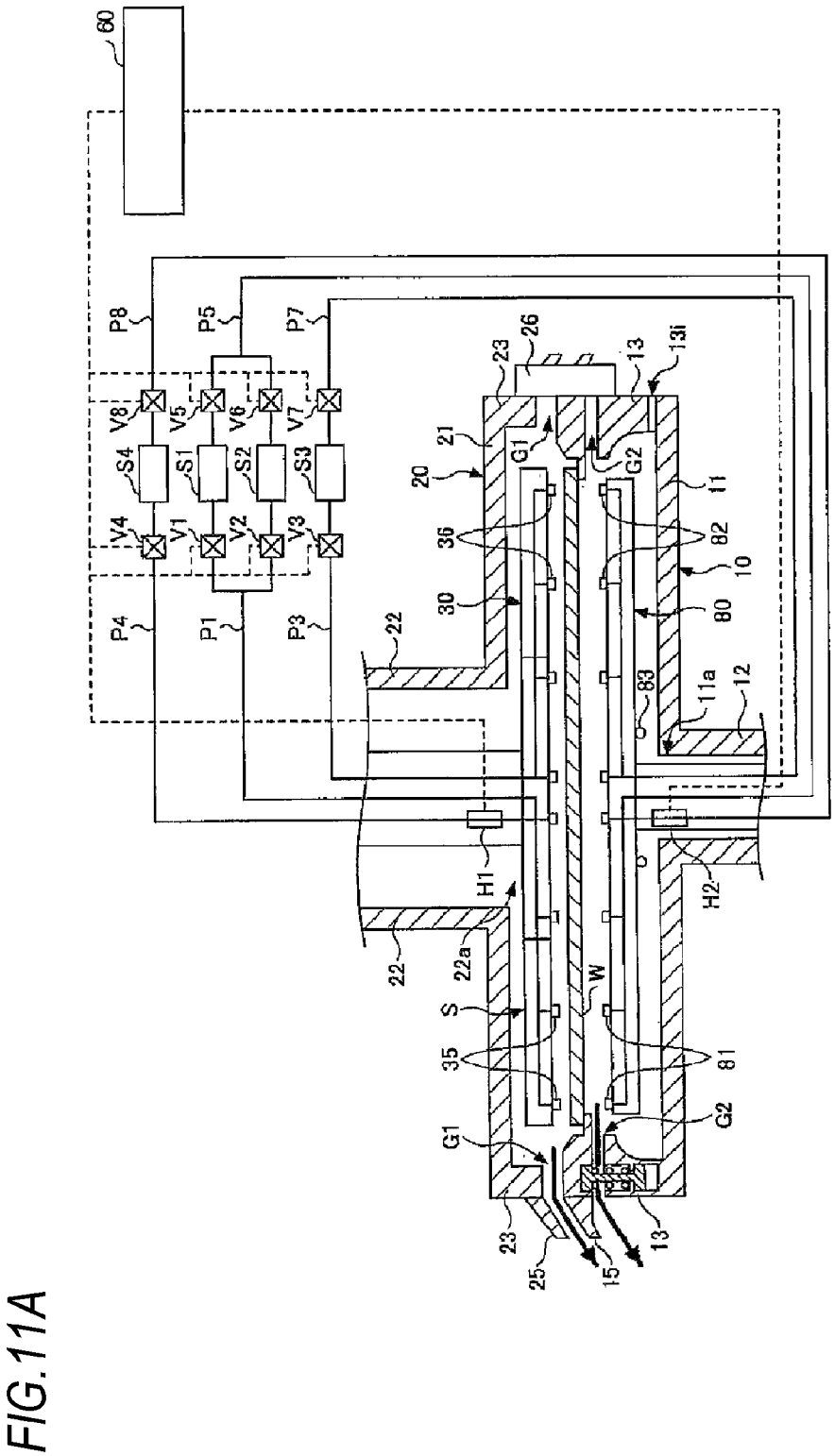
FIG. 11A is a cross-sectional view illustrating the operations of the main parts of the liquid processing apparatus of FIG. 10 in a case where a cover is located at an opening position, an upper liquid supplying member is located at a processing liquid supplying position, and a lower liquid supplying member is located at an opening position.
Figure 11B:
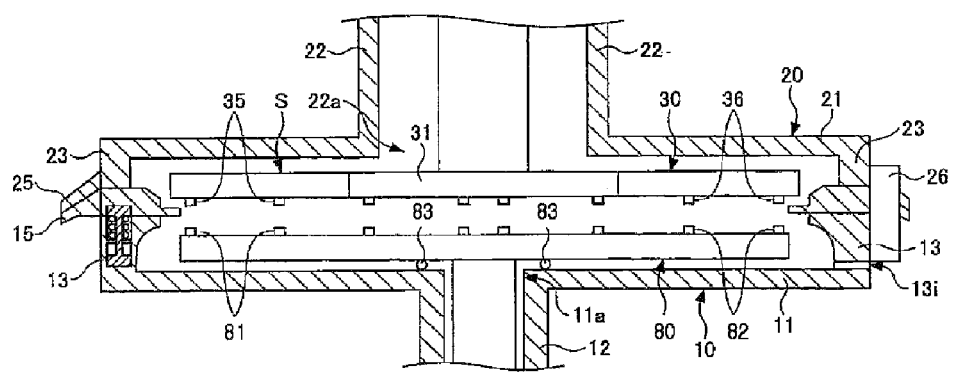
FIG. 11B is a cross-sectional view illustrating the operations of the main parts of the liquid processing apparatus of FIG. 10 in a case where the cover is located at the closing position, the upper liquid supplying member is located at the processing liquid supplying position, and the lower liquid supplying member is located at a closing position.
Figure 11C:
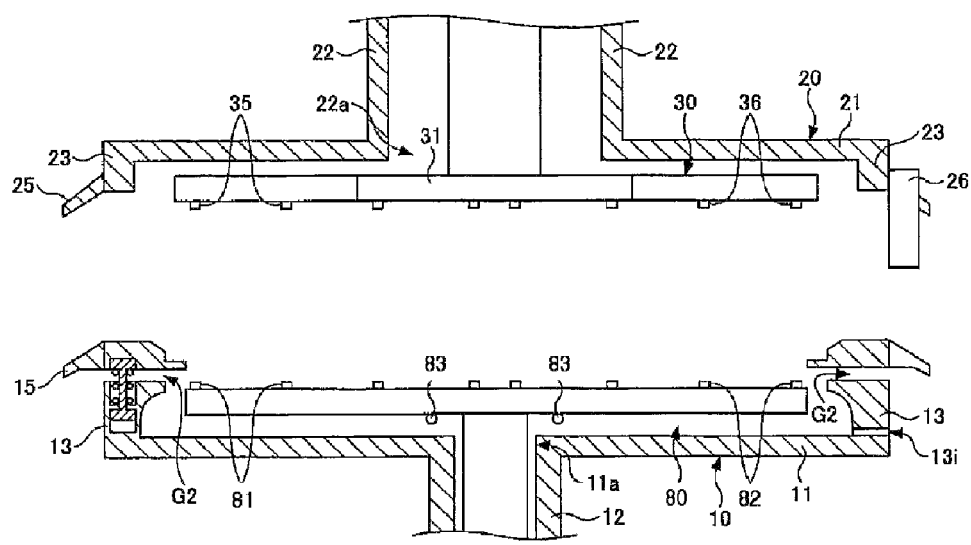
FIG. 11C is a cross-sectional view illustrating the operations of the main parts of the liquid processing apparatus of FIG. 10 in a case where the cover is located at a standby position, the upper liquid supplying member is located at a standby position, and the lower liquid supplying member is located at an opening position.
Figure 12A:
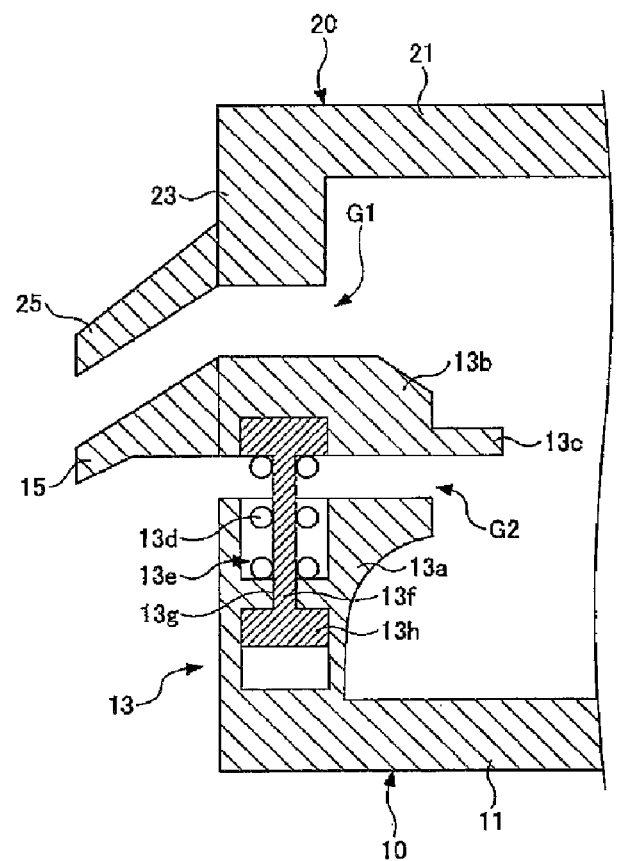
FIG. 12A is an enlarged view of a portion of FIG. 11A.
Figure 12B:
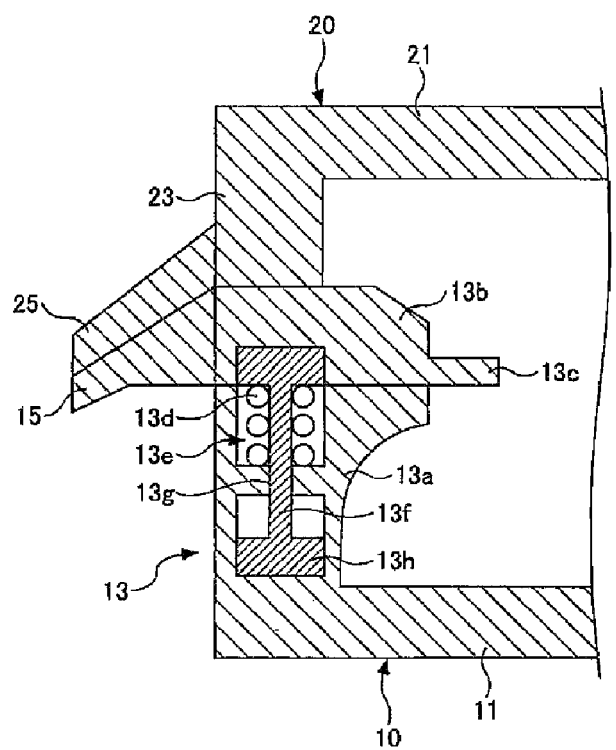
FIG. 12B is an enlarged view of a portion of FIG. 11B.
Figure 13A:
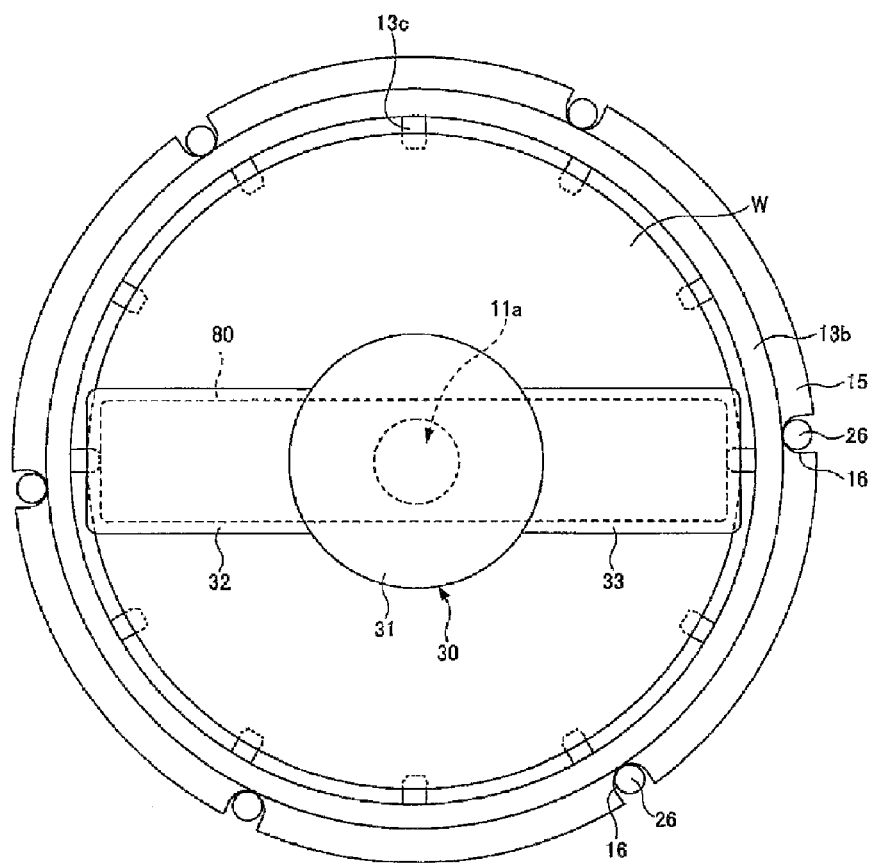
FIG. 13A is a plan view illustrating the operations of the main parts of the liquid processing apparatus of FIG. 10 in a case where the upper liquid supplying member and the lower liquid supplying member are disposed at positions where the members overlap each other when viewed from the top.
Figure 13B:
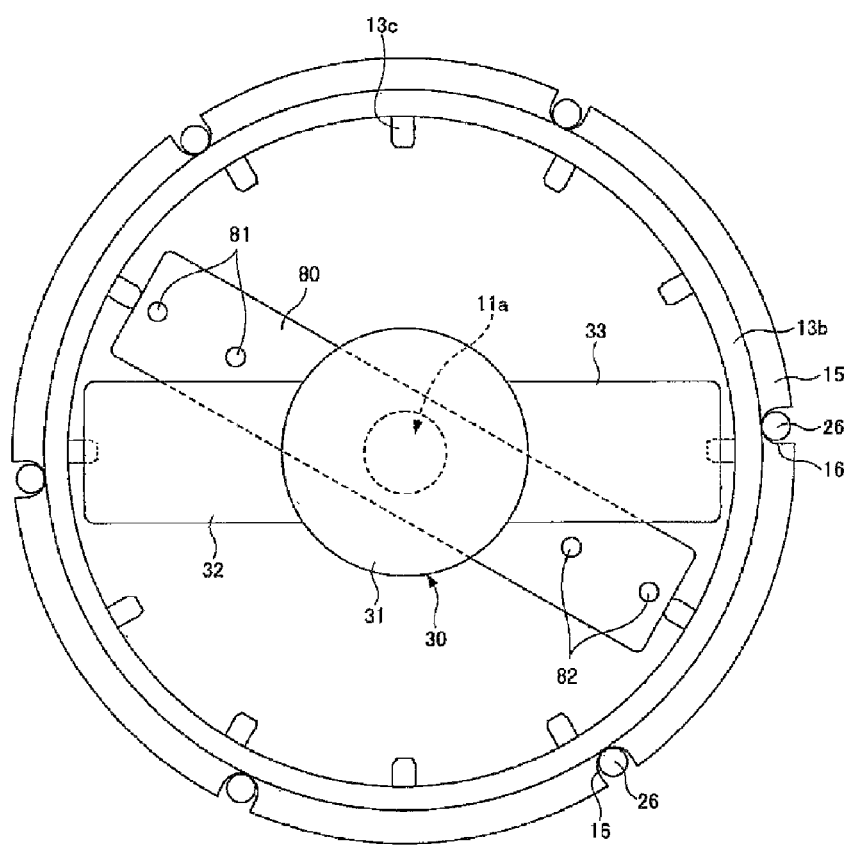
FIG. 13B is a plan view illustrating the operations of the main parts of the liquid processing apparatus of FIG. 10 in a case where the upper liquid supplying member and the lower liquid supplying member are disposed at positions where the members do not overlap each other.

FIG. 10 is a cross-sectional view illustrating a liquid processing apparatus according to the second exemplary embodiment of the present disclosure. FIGS. 11A to 11C are cross-sectional views illustrating the operations of the main parts of liquid processing apparatus of FIG. 10. FIG. 11A is a cross-sectional view illustrating a scenario in which a cover is located at an opening position, an upper liquid supplying member is located at a processing liquid supplying position, and a lower liquid supplying member is located at an opening position. FIG. 11B is a cross-sectional view illustrating a scenario in which the cover is located at a closing position, the upper liquid supplying member is located at the processing liquid supplying position, and the lower liquid supplying member is located at a closing position. FIG. 11C is a cross-sectional view illustrating a scenario in which the cover is located at a standby position, the upper liquid supplying member is located at a standby position, and the lower liquid supplying member is located at the opening position. In FIG. 11A, for easier viewing, a signal line connecting valves V1 to V8, heating units H1 and H2, and a control unit 60 is denoted by a dotted line. In FIGS. 11B and 11C, for easier viewing, valves V1 to V8 and the like are not shown. FIGS. 12A and 12B are partially enlarged views of FIGS. 11A and 11B. FIGS. 13A and 13B are plan views illustrating the operations of the main parts of the liquid processing apparatus of FIG. 10. Specifically, FIG. 13A is a plan view illustrating a scenario in which the upper liquid supplying member and the lower liquid supplying member are disposed at positions where the members overlap each other when viewed from the top, and FIG. 13B is a plan view illustrating a scenario in which the upper liquid supplying member and the lower liquid supplying member are disposed at positions where the members do not overlap each other. FIGS. 11B, 11C, 12A, 12B, and 13B show a state where wafer W is not present.

As shown in FIG. 10, liquid processing apparatus 1 includes wafer support member 10 supporting wafer W horizontally, motor M rotating wafer support member 10, and cover 20 integrally rotatably connected to wafer support member 10 to form processing chamber S for liquid processing wafer W together with wafer support member 10. Liquid processing apparatus 1 includes upper liquid supplying member 30 disposed in processing chamber S to supply a processing liquid to rotating wafer W from the upper side and lower liquid supplying member 80 supplying the processing liquid to rotating wafer W from the lower side. Liquid processing apparatus 1 includes cup 40 surrounding annular gap G1 formed between outer circumferential part 13 of wafer support member 10 and outer circumferential part 23 of cover 20. The inside of cup 40 is exhausted by an exhaust mechanism E installed as a factory equipment.

In liquid processing apparatus 1, motor M rotates wafer support member 10 and cover 20 or wafer W while wafer support member 10 and cover 20 form processing chamber S. Upper liquid supplying member 30 and lower liquid supplying member 80 supply a processing liquid to rotating wafer W. The processing liquid supplied to the upper surface of rotating wafer W is swept away outside wafer W by centrifugal force and thus recovered in cup 40 through annular gap G1. In this case, exhaust mechanism E exhausts the inside of cup 40 to form air flow from an upper space of wafer W in processing chamber S toward cup 40 through annular gap G1. The air flow serves to discharge the processing liquid to cup 40. Hereinafter, the respective components of liquid processing apparatus 1 will be described.

As shown in FIGS. 12A and 12B, outer circumferential part 13 includes a tubular part 13a which extends upward from an outer edge of plate part 11 and an annular part 13b which freely moves between a contact position (FIGS. 11B and 12B) where annular part 13b is in contact with an upper surface of tubular part 13a and a separation position (FIGS. 11A and 12A) where annular part 13b is separated from the upper surface of tubular part 13a. Outer circumferential part 13 extends inward from annular part 13b and has a click part 13c supporting an outer edge of wafer W and a deflection part 13d deflecting annular part 13b from the contact position toward the separation position.

Deflection part 13d is constituted by, for example, a coil spring or the like and disposed between an inner bottom surface of a concave part 13e formed on the upper surface of tubular part 13a and annular part 13b. A plurality of sets of deflection parts 13d and concave parts 13e are installed at predetermined intervals in a circumferential direction of tubular part 13a. Annular part 13b moves from the separation position (FIGS. 11A and 12A) to the contact position (FIGS. 11B and 12B) by pushing annular part 13b down against deflection force of deflection part 13d. When the force that pushes down annular part 13b is used up, annular part 13b returns to the separation position from the contact position by the deflection force of deflection part 13d, such that a gap G2 is formed between annular part 13b and tubular part 13a.

A pin part 13f extends downward from annular part 13b and pin part 13f is supported in a guide hole 13g formed on the inner bottom surface of concave part 13e to be movable vertically. In order to prevent pin part 13f from coming out from guide hole 13g, pin part 13f includes a head part 13h having an outer diameter larger than an inner diameter of guide hole 13g at a front end portion.

Annular part 13b has an inner diameter slightly larger than an outer diameter of wafer W. A plurality of click parts 13c (12 in FIGS. 13A and 13B) extending inward from annular part 13b are formed at predetermined intervals in a circumferential direction of annular part 13b. As shown in FIG. 11A, click parts 13c are in contact with a circumferential edge of the lower surface of wafer W to horizontally support wafer W. The upper surface of wafer W supported by click parts 13c and the upper surface of annular part 13b are positioned on substantially the same plane. The lower surface of wafer W supported by click parts 13c and the lower surface of annular part 13b are positioned on substantially the same plane. Therefore, the processing liquid swept away from the upper and lower surfaces of wafer W easily passes through annular gap G1 and gap G2 along the upper and lower surfaces of annular part 13b, and thus, is completely discharged outside.

Guide part 15 guiding the air flow discharged outside from processing chamber S extends from annular part 13b so as to be inclined downward toward the outside.

An opening 11a is formed in wafer support member 10 (more specifically plate part 11). A tubular rotation axis member 12 extending from a circumferential edge of opening 11a downward is attached to wafer support member 10.

Cover 20, as shown in FIG. 10, is connected to cover elevating mechanism 122 such as a linear motor through cover support member 121. Cover 20 is movable vertically between the opening position (FIGS. 11A and 12A) where gap G1 between outer circumferential part 23 of cover 20 and outer circumferential part 13 of wafer support member 10 is opened and the closing position (FIGS. 11B and 12B) where gap G1 between outer circumferential part 23 of cover 20 and outer circumferential part 13 of wafer support member 10 is closed, by cover elevating mechanism 122.

As cover 20 moves from the opening position to the closing position, cover 20 comes in contact with annular part 13b to push annular part 13b down, such that annular part 13b moves from the separation position to the contact position. Meanwhile, as cover 20 moves from the closing position to the opening position, cover 20 is separated from annular part 13b and the force of pushing down annular part 13b is used up, such that annular part 13b returns to the separation position from the contact position by deflection force of deflection part 13d.

When wafer W is carried in liquid processing apparatus 1, cover 20 is raised up to a standby position (FIG. 11C) higher than the opening position by cover elevating mechanism 122, such that connection pins 26 come out from notched portions 16. When wafer W is supported by wafer support member 10, cover 20 is lowered to a connection position between the standby position (FIG. 11C) and the closing position (FIGS. 11B and 12B) by cover elevating mechanism 122, such that connection pins 26 are inserted into notched portions 16. The connection position may be the same position as the opening position.

When cover 20 is located at the opening position (connection position), outer circumferential part 23 of cover 20 and outer circumferential part 13 of wafer support member 10 are separated from each other. Therefore, annular gap G1 is formed between outer circumferential part 23 of cover 20 and outer circumferential part 13 of wafer support member 10 and gap G2 is formed between annular part 13b and tubular part 13a in outer circumferential part 13.

The vertical position of cover 20 may be regulated depending on the purpose. For example, (1) when the processing liquid is supplied to the upper surface and the lower surface of rotating wafer W, the position of cover 20 is set to the connection position (FIGS. 11A and 12A). Therefore, the processing liquid swept away from the upper surface of rotating wafer W by centrifugal force is recovered in cup 40 through annular gap G1. The processing liquid swept away from the lower surface of rotating wafer W is recovered in cup 40 through gap G2.

(2) when the cleaning liquid is supplied and stored in processing chamber S, the position of cover 20 is set to the closing position (FIGS. 11B and 12B) in order to restrict the outflow of cleaning liquid from the side of processing chamber S.

When a liquid level of cleaning liquid reaches a predetermined height (for example, the liquid level of cleaning liquid becomes higher than plate part 21), cover 20 moves to opening position (FIGS. 11A and 12A), and thus, the cleaning liquid stored in an internal space of cover 20 is discharged from annular gap G1 and gap G2 at one time. Therefore, foreign substances attached to cover 20 or upper liquid supplying member 30 are removed.

Upper liquid supplying member 30, as shown in FIGS. 13A and 13B, further includes two extensions 32a and 33a extending from an outer circumferential surface of a main body part 31. Extensions 32a and 33a extend in parallel with a diameter direction of wafer W and front ends thereof are positioned at an upper side of an outer edge of wafer W.

As shown in FIG. 11A, upper liquid supplying member 30 is disposed in processing chamber S to supply the processing liquid to rotating wafer W from the upper side. The processing liquid may also be used as a cleaning liquid that cleans the inside of processing chamber S.

A nozzle part 35 is connected to an end of a branched pipe that is branched from pipe P1. Nozzle part 35 may be protruded downward from main body part 31 and extensions 32a and 33a or may be buried inside main body part 31 and extensions 32a and 33a.

A nozzle part 36 is connected to an end of branched pipe that is branched from a pipe P3. Nozzle part 36 may be protruded downward from main body part 31 and extensions 32a and 33a or may be buried inside main body part 31 and extensions 32a and 33a.

Upper liquid supplying member 30 is connected to a gas supply source S4 through a pipe P4 having a valve V4 installed at the middle thereof. A gas supplied to upper liquid supplying member 30 from gas supply source S4 (for example, nitrogen gas or an inert gas such as noble gas, and dry air) is supplied from nozzle part 35 to wafer W and the supply amount thereof may be controlled by regulating the opening degree of valve V4.

A heating unit H1 heating the gas to a predetermined temperature is installed around an outlet of pipe P4 that connects gas supply source S4 and upper liquid supplying member 30. Heating unit H1 may also be installed in liquid supply source S4.

As shown in FIG. 11A, lower liquid supplying member 80 is disposed in processing chamber S and supplies the processing liquid to rotating wafer W from the lower side. The processing liquid may also be used as a cleaning liquid that cleans the inside of processing chamber S.

Like upper liquid supplying member 30, lower liquid supplying member 80, as shown in FIG. 11A, is connected to liquid supply sources S1 and S2 through a pipe P5 having valves V5 and V6 installed at the middle thereof. A nozzle part 81 is connected to an end of each branched pipe that is branched from pipe P5. Nozzle part 81 discharges a chemical liquid or a rinsing liquid upward and the discharge amount thereof may be regulated by regulating the opening degree of valves V5 and V6.

Lower liquid supplying member 80 is connected to a liquid supply source S3 through a pipe P7 having a valve V7 installed at the middle thereof. A nozzle part 82 is connected to an end of each branched pipe that is branched from pipe P7. Nozzle part 82 discharges a drying solvent upward and the discharge amount thereof may be regulated by regulating the opening degree of valve V7.

Lower liquid supplying member 80 is connected to liquid supply source S4 through a pipe P8 having a valve V7 installed at the middle thereof. A nozzle part 81 is connected to an end of each branched pipe that is branched from pipe P8. Nozzle part 81 discharges a gas upward and the discharge amount thereof may be regulated by regulating the opening degree of valve V8. A heating unit H2 heating the gas to a predetermined temperature is installed around an outlet of pipe P8. Heating unit H2 may also be installed in liquid supply source S4.

As shown in FIG. 10, lower liquid supplying member 80 is connected to a lower liquid supplying member elevating mechanism 142 such as a linear motor through a support rod 141 and is movable vertically by lower liquid supplying member elevating mechanism 142. Support rod 141 is inserted through an opening 11a formed in a lower part of processing chamber S (in the exemplary embodiment of the present disclosure, plate part 11 of wafer support member 10).

Lower liquid supplying member 80 is movable between a closing position (FIG. 11b) where opening 11a is closed as lower liquid supplying member 80 comes in contact with wafer support member 10 (specifically, plate part 11) through a sealing member 83 and an opening position (FIG. 11A) higher than the closing position, where the contact is released. Sealing member 83 is configured by an O-ring or packing and has an inner diameter larger than opening 11a. Sealing member 83 may be fixed to lower liquid supplying member 80 or wafer support member 10.

A vertical position of lower liquid supplying member 80 is set depending on their purpose. For example, (1) when the processing liquid is supplied to wafer W, the position of lower liquid supplying member 80 is set to the opening position (FIG. 11A) in order to allow rotation of wafer support member 10.

(2) when the cleaning liquid is stored in processing chamber S, the position of lower liquid supplying member 80 is set to the closing position (FIG. 11B) in order to prevent the cleaning liquid from flowing downward from opening 11a.

(3) when the cleaning liquid is almost removed in processing chamber S (for example, when only droplets remain in wafer support member 10), the position of lower liquid supplying member 80 is set to the opening position (FIG. 11A) in order to sweep away the droplets outside by centrifugal force by rotating wafer support member 10. When the droplets are swept away outside by centrifugal force, the position of lower liquid supplying member 80 needs to be higher than the closing position and may be the same as or different from the position of lower liquid supplying member 80 when the wafer W is subjected to liquid processing.

Lower liquid supplying member 80 is horizontally rotatable by a rotating mechanism 143 that is interposed between support rod 141 and lower liquid supplying member elevating mechanism 142. When viewed from the top, lower liquid supplying member 80 is rotatable between a position (FIG. 13A) where lower liquid supplying member 80 and upper liquid supplying member 30 overlap each other and a position (FIG. 13B) where at least a portion of the plurality of nozzle parts 81 discharging the cleaning liquid do not overlap upper liquid supplying member 30. A rotation position of lower liquid supplying member 80 is set depending on the purpose.

For example, (1) when the processing liquid is supplied to the upper and lower surfaces of wafer W, the rotation position of lower liquid supplying member 80 is set to a position shown in FIG. 13A such that liquid pressure from lower liquid supplying member 80 and liquid pressure from upper liquid supplying member 30 offset each other.

(2) when the cleaning liquid is supplied to cover 20 from lower liquid supplying member 80 while wafer W is not supported by wafer support member 10, the rotation position of lower liquid supplying member 80 is installed at a position shown in FIG. 13B. This makes it possible to prevent the cleaning liquid supplied from lower liquid supplying member 80 and the cleaning liquid supplied from upper liquid supplying member 30 from running into each other.

A predetermined apparatus of liquid processing apparatus 1 (for example, motor M, valves V1 to V8, heating units H1 and H2, cover elevating mechanism 122, and upper liquid supplying member elevating mechanism 132, lower liquid supplying member elevating mechanism 142, and rotation mechanism 143) is connected to a control unit 60 controlling an operation of liquid processing apparatus 1 through a signal line, as shown in FIG. 10 and FIG. 11A.

For example, control unit 60 supplies a predetermined amount of cleaning liquid into processing chamber S from upper liquid supplying member 30 and/or lower liquid supplying member 80 while wafer W is not supported by wafer support member 10.

While the cleaning liquid is supplied and stored into processing chamber S, control unit 60 sets the position of cover 20 to the closing position and the position of lower liquid supplying member 80 to the closing position. In this case, the position of upper liquid supplying member 30 is not particularly limited, but for example, may be set to the processing liquid supplying position.

Since control unit 60 monitors the amount of cleaning liquid supplied into processing chamber S, when the liquid level of cleaning liquid stored in processing chamber S reaches a predetermined height (for example, when the liquid level of cleaning liquid becomes higher than plate part 21 of cover 20), control unit 60 changes the position of cover 20 from the closing position to the opening position to discharge the cleaning liquid stored in processing chamber S outside from annular gap G1 and gap G2.

After changing the position of cover 20 from the closing position to the opening position, control unit 60 rotates wafer support member 10, such that droplets of cleaning liquid attached to wafer support member 10 are discharged through an outlet 13*i* by rotating wafer support member 10.

Control unit 60 sprays the cleaning liquid injected from lower liquid supplying member 80 to rotating cover while wafer W is not supported by wafer support member 10. While spraying the cleaning liquid onto rotating cover 20, control unit 60 sets the position of cover 20 to the opening position and the position of lower liquid supplying member 80 to the opening position. In this case, the position of upper liquid supplying member 30 is not particularly limited, but for example, may be set to the processing liquid supplying position.

Control unit 60 supplies a gas into processing chamber S from upper liquid supplying member 30 and/or lower liquid supplying member 80 while wafer W is not supported by wafer support member 10. While supplying the gas into processing chamber S, control unit 60 sets the position of cover 20 to the opening position. The position of upper liquid supplying member 30 is not particularly limited, but for example, may be set to a processing liquid supplying position. The position of lower liquid supplying member 80 may be the closing position or the opening position.

Next, the operation (liquid processing method) when the liquid processing apparatus configured as described above performs liquid processing will be described.

First, similar to the first exemplary embodiment, a processing chamber S is formed. An annular gap G1 and a gap G2 are formed at a side of processing chamber S. Subsequently, a motor M integrally rotates wafer support member 10, cover 20, and wafer W. A processing liquid is supplied to upper and lower surfaces of rotating wafer W from an upper liquid supplying member 30 and a lower liquid supplying member 80, such that the same processing as in the first exemplary embodiment is performed.

Here, the processing liquid swept away from the upper surface of rotating wafer W is recovered in cup 40 through annular gap G1. The processing liquid swept away from the lower surface of rotating wafer W is recovered in cup 40 through gap G2. The processing liquid, which overflows a plate part 11 of wafer support member 10 is moved outside by centrifugal force, is discharged through an outlet (13*i*) (FIGS. 11A and 11B) formed at a lower part of a tubular part 13*a*, and thus, is recovered in cup 40.

Finally, similar to the first exemplary embodiment, wafer W is carried out from liquid processing apparatus 1 and liquid processing of wafer W is completed. When the liquid processing of wafer W is completed, as shown in FIG. 11C, cover 20 is located at a standby position, upper liquid supplying member 30 is located at a standby position, and lower liquid supplying member 80 is located at an opening position.

Next, the operation (cleaning method) when liquid processing apparatus 1 configured as described above performs cleaning will be described with reference to FIG. 14. The cleaning of liquid processing apparatus 1 is performed after wafer W is carried out from liquid processing apparatus 1 and performed while wafer W is not supported by wafer support member 10. The cleaning method shown in FIG. 14 is implemented by control unit 60.

Figure 14:
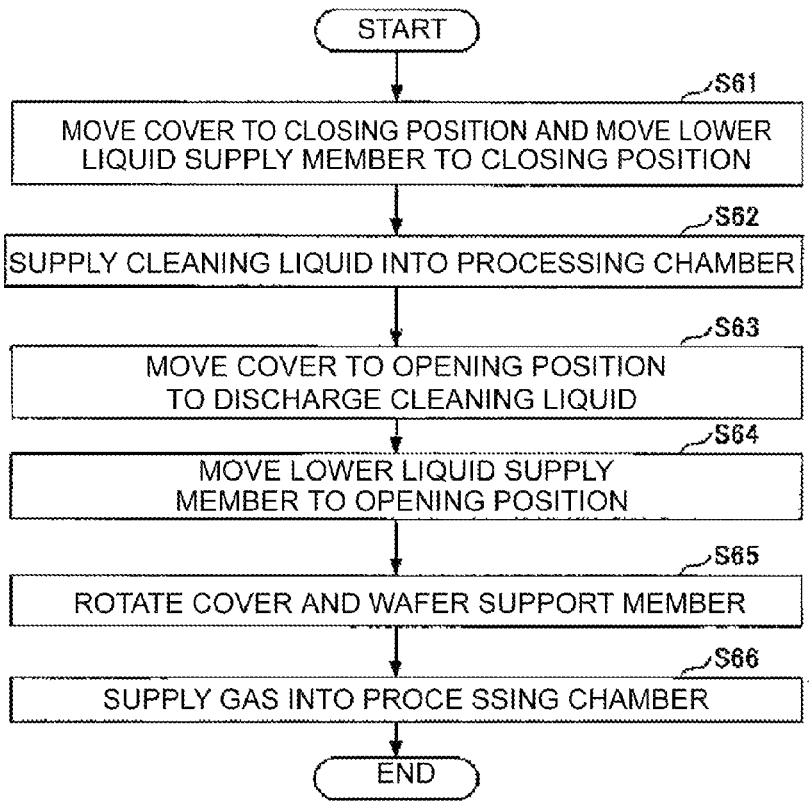
FIG. 14 is a flowchart (1) of a cleaning method of the liquid processing apparatus according to the second exemplary embodiment.

At step S61 shown in FIG. 14, cover 20 is lowered to the closing position (FIGS. 11B and 12B) by a cover elevating mechanism 122 and thus an annular part 13*b* moves up to a contact position in order to prevent the cleaning liquid from being discharged from the side of processing chamber S. In order to prevent the cleaning liquid from flowing and falling through an opening 11*a* formed at a lower part of processing chamber S, lower liquid supplying member 80 is lowered to the closing position (FIG. 11B) by lower liquid supplying member elevating mechanism 142.

Subsequently, the cleaning liquid (for example, DIW) is supplied into processing chamber S by upper liquid supplying member 30 and/or lower liquid supplying member 80 (step S62). Since upper liquid supplying member 30 and lower liquid supplying member 80 are disposed in processing chamber S, the cleaning liquid may be stored in processing chamber S. The cleansing liquid may be convected or stirred by continuing to supply the cleaning liquid, thereby washing off accretions in processing chamber S.

A liquid level of cleaning liquid reaches a predetermined height (for example, when the liquid level of the cleaning liquid becomes higher than plate part 21 of cover 20), the supply of cleaning liquid is stopped. Thereafter, cover 20 is raised from the closing position (FIGS. 11B and 12B) up to the opening position (FIGS. 11A and 12A) by a cover elevating mechanism 122 (step S63). As a result, the cleaning liquid stored in an internal space of cover 20 is discharged from annular gap G1 and gap G2 at one time, thus washing off foreign substance attached to cover 20 or upper liquid supplying member 30.

Steps S61 to S63 may be repeated several times.

Meanwhile, the cleaning liquid stored in an internal space of wafer support member 10 is gradually discharged through an outlet 13*i* formed at an outer circumferential part 13.

When the remaining cleaning liquid is almost removed (for example, when only droplets remain in wafer support member 10), lower liquid supplying member 80 is raised from the closing position (FIG. 11B) up to the opening position (FIG. 11A) (step S64).

Subsequently, wafer support member 10 and cover 20 located at the opening position are integrally rotated by motor M (step S65). The droplets attached to rotating cover 20 are moved outside by centrifugal force and discharged through annular gap G1 formed at the side of processing chamber S. Similarly, the droplets attached to rotating wafer support member 10 move outside by centrifugal force and is discharged through outlet 13*i* formed at the side of processing chamber S.

In the exemplary embodiment of the present disclosure, since outlet 13*i* is formed at a lower portion of tubular part 13*a* and an inclination is formed so that an inner circumferential surface of tubular part 13*a* orients (outward in a diameter direction) downward toward the outside around outlet 13*i*, the droplets attached to tubular part 13*a* may be effectively discharged from outlet 13*i* by centrifugal force.

Finally, in order to dry the inside of processing chamber S, a gas is supplied from upper liquid supplying member 30 and/or lower liquid supplying member 80 into processing chamber S (step S66). In order to shorten a drying time, the gas may be supplied into processing chamber S after being heated to a predetermined temperature.

A performing sequence of steps S65 and S66 is not fixed and the steps may be performed simultaneously.

Figure 15:
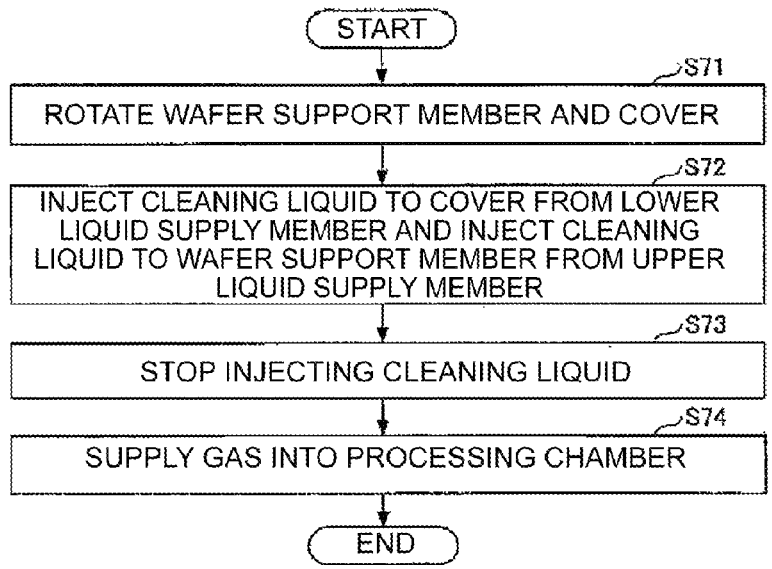
FIG. 15 is a flowchart (2) of a cleaning method of the liquid processing apparatus according to the second exemplary embodiment.

Next, the operation (cleaning method) when liquid processing apparatus 1 configured as described above performs another cleaning will be described with reference to FIG. 15. Similar to the cleaning shown in FIG. 14, the cleaning shown in FIG. 15 is performed after wafer W is carried out from liquid processing apparatus 1 and performed while wafer W is not supported by wafer support member 10. The cleaning shown in FIG. 15 may be performed either in combination with the cleaning shown in FIG. 14 or alone. When the cleaning shown in FIG. 15 and the cleaning shown in FIG. 14 are performed in combination, the processing sequence thereof is not fixed and the cleaning shown in FIG. 15 may be performed during the cleaning shown in FIG. 14. The cleaning method shown in FIG. 15 is implemented by control unit 60.

At step S71 shown in FIG. 15, wafer support member 10 and cover 20 are integrally rotated by motor M. In this case, in order to rotate cover 20, the position of cover 20 is set to the opening position (FIGS. 11A and 12A), processing chamber S is formed, and annular gap G1 and gap G2 are formed at the side of processing chamber S. In order to allow rotation of wafer support member 10, the position of lower liquid supplying member 80 is set to the opening position.

Subsequently, the cleaning liquid (for example, DIW) is injected from lower liquid supplying member 80 toward rotating cover 20 (specifically, plate part 21), such that cover 20 is physically cleaned by impact power of the cleaning liquid (step S72). The impact power of the cleaning liquid may be regulated by regulating the opening degree of a valve (for example, valve V6). The cleaning liquid moves outside by centrifugal force to wash off foreign substances attached to plate part 21. The cleaning liquid including the foreign substances is mainly discharged through annular gap G1.

A plurality of nozzle parts 81 of lower liquid supplying member 80 are arranged at predetermined intervals toward an outer edge from a central portion of processing chamber S. Therefore, the cover 20 (specifically, plate part 21) may be cleaned overall. Nozzle part 81 may inject the cleaning liquid in a shower pattern or a mist pattern.

The rotation position of lower liquid supplying member 80 is set so that at least a portion of the plurality of nozzles 81 do not overlap upper liquid supplying member 30. Therefore, cover 20 may be completely cleaned.

The cleaning liquid (for example, DIW) is injected from upper liquid supplying member 30 toward rotating wafer support member 10 (specifically, plate part 11), such that wafer support member 10 is physically cleaned by impact power of the cleaning liquid (step S72). The impact power of the cleaning liquid may be regulated by regulating the opening degree of a valve (for example, valve V2). The cleaning liquid moves outside by centrifugal force to wash off foreign substances attached to plate part 11. The cleaning liquid containing the foreign substances is mainly discharged through outlet 13i.

A plurality of nozzle parts 35 of upper liquid supplying member 30 are arranged at predetermined intervals toward the outer edge from the central portion of processing chamber S. Therefore, the wafer support member 10 (specifically, plate part 11) may be cleaned overall. Nozzle parts 35 may inject the cleaning liquid in a shower pattern or a mist pattern.

At step S72, the cleaning liquid is injected from lower and upper liquid supplying members 80 and 30 toward both rotating cover 20 and wafer support member 10, but the cleaning liquid may not be injected to wafer support member 10.

Subsequently, the supply of cleaning liquid from upper liquid supplying member 30 and lower liquid supplying member 80 is stopped (step S73) and droplets attached to wafer support member 10 and cover 20 which integrally rotate are swept away toward the outside by centrifugal force.

Finally, in order to dry the inside of processing chamber S, a gas is supplied from upper liquid supplying member 30 and/or lower liquid supplying member 80 into processing chamber S (step S74). In order to shorten a drying time, the gas may be supplied into processing chamber S after being heated to a predetermined temperature. Here, wafer support member 10 and cover 20 may not be rotated.

Steps S73 and S74 may be performed simultaneously.

Effect of Second Exemplary Embodiment

As described above, in the exemplary embodiment of the present disclosure, like the first exemplary embodiment, annular gaps G1 and G2 may be regulated according to the process for processing wafer W by a predetermined liquid. Therefore, the states of the air flow discharged from and introduced into processing chamber S may be optimized and the state of the air flow at the upper side of wafer W may be optimized.

According to the present exemplary embodiment, it is possible to clean a member disposed in the processing chamber or a wall surface of the processing chamber to which the mist or steam of the processing liquid dispersed to the upper side of the wafer is attached. Accordingly, it is possible to prevent crystallized accretions from falling onto the substrate, which are particles.

From the foregoing, the exemplary embodiments and the modified examples of the present disclosure have been described, but the present disclosure is not limited thereto. Various modifications or substitutions may be made without departing from the scope and spirit of the present disclosure.

For example, in the present exemplary embodiment, cover 20 is elevated, but cover 20 needs only to be relatively elevated with respect to wafer support member 10, and for example, wafer support member 10 may also be elevated.

In order to close opening 11a of wafer support member 10, or allow the rotation of wafer support member 10, lower liquid supplying member 80 is elevated, but lower liquid supplying member 80 needs only to be relatively elevated with respect to wafer support member 10, and for example, wafer support member 10 may also be elevated.

The plurality of nozzle parts 35 and 81 injecting the cleaning liquid are arranged at predetermined intervals toward an outer edge from the central portion of processing chamber S, but a plurality of nozzle parts may also be arranged at predetermined intervals from one of two points (two points of an outer edge) symmetrical with respect to the central portion of processing chamber S to the other point.

Rotation mechanism 143 horizontally rotates lower liquid supplying member 80, but needs only to relatively horizontally rotate lower liquid supplying member 80 and upper liquid supplying member 30, and for example, may also horizontally rotate upper liquid supplying member 30.

Wafer W is not limited to a semiconductor wafer, and for example, may be a glass substrate for an FPD.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus for performing a liquid processing on a substrate, the liquid processing apparatus comprising:
    a support member configured to horizontally support the substrate;
    a rotation mechanism configured to rotate the support member;
    an outer circumferential part extending upward from the outer part of the support member;
    a liquid supplying member configured to supply a processing liquid from an upper side to the substrate supported by the support member;
    a gap forming member disposed at an upper side of the support member and integrally rotatably connected to the support member to form an annular gap between the gap forming member and the outer circumferential part of the support member such that the gap forming member is integrally rotated with the support member by the rotation mechanism;
    a cup configured to receive the processing liquid swept away from the rotating substrate through the annular gap;
    an elevating mechanism configured to elevate the gap forming member; and
    a control unit configured to control an overall operation of the liquid processing apparatus,
    wherein the control unit is programmed such that the liquid supplying member sequentially supplies a plurality of kinds of processing liquids to the substrate for each of a plurality of kind of processings, and the elevating mechanism raises or lowers the gap forming member to regulate the annular gap according to the kinds of processing liquids supplied to the substrate from the liquid supplying member while the gap forming member is being integrally rotated with the support member and the annular gap is regulated according to a kind of the processing liquid supplied to the substrate and a rotation speed of the substrate such that a state of air flow at an upper side of the substrate varies according to the kind of the processing liquid supplied to the substrate and a rotation speed of the substrate.

2. The liquid processing apparatus of claim 1, wherein a guide part guiding air flow discharged outside through the annular gap is formed at an outer circumferential part of the support member.

3. The liquid processing apparatus of claim 1, wherein the liquid supplying member sequentially supplies a chemical liquid and a rinsing liquid for removing the chemical liquid to the substrate, and the annular gap for the case where the chemical liquid having a higher temperature than the rinsing liquid is supplied to the substrate is set to be narrower than the annular gap for the case where the rinsing liquid is supplied to the substrate.

4. The liquid processing apparatus of claim 1, wherein the gap forming member forms a processing chamber that processes the substrate by a predetermined liquid process together with the support member and includes an opening that introduces a gas into the processing chamber, and the liquid processing apparatus further includes a moving mechanism configured to raise or lower the liquid supplying member to approach or be separated from the opening part of the processing chamber.

5. The liquid processing apparatus of claim 4, wherein the gap forming member includes a tubular duct part extending upward from an outer circumferential part of the opening, and the liquid supplying member include a disk-shaped main body part disposed to be opposed to the opening.

6. The liquid processing apparatus of claim 5, wherein a diameter of the main body part is larger than a diameter of the opening having a circular shape.

7. The liquid processing apparatus of claim 1, further comprising:
    an annular partition wall configured to divide the annular gap into an upper portion and a lower portion; and
    a connection member configured to connect the annular partition wall and an outer circumferential part of the support member or the gap forming member,
wherein a gap through which air flow passes is formed between the annular partition wall and the outer circumferential part of the support member or the gap forming member.

8. The liquid processing apparatus of claim 7, wherein the annular partition wall and the outer circumferential part of the support member or the gap forming member forms a labyrinth structure narrowing the air flow that flows through the gap.

9. The liquid processing apparatus of claim 1, wherein the gap forming member includes a plate part and an outer circumferential part extending downward from the outer part of the plate part, and
    the annular gap is formed between the outer circumferential part of the support member and the outer circumferential part of the gap forming member.

10. The liquid processing apparatus of claim 3, wherein a drying solvent is supplied to the substrate after the rinsing liquid and the annular gap is set to be narrower when the drying solvent is supplied than when the chemical liquid having a higher temperature is supplied.

* * * * *